(12) United States Patent
Martellock et al.

(10) Patent No.: US 7,692,570 B2
(45) Date of Patent: Apr. 6, 2010

(54) DIRECT RF COMPLEX ANALOG TO DIGITAL CONVERTER

(75) Inventors: Paul T. Martellock, Cazenovia, NY (US); Byron W. Tietjen, Baldwinsville, NY (US); Michael J. Walsh, Baldwinsville, NY (US); Lindsay C. Peterson, Liverpool, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/014,846

(22) Filed: Jan. 16, 2008

(65) Prior Publication Data
US 2009/0179786 A1 Jul. 16, 2009

(51) Int. Cl.
*H03M 1/12* (2006.01)
(52) U.S. Cl. ...................... 341/155; 455/307
(58) Field of Classification Search ............. 341/155; 702/76; 375/219; 370/389
See application file for complete search history.

(56) References Cited

U.S. PATENT DOCUMENTS

| | | | |
|---|---|---|---|
| 4,893,316 A | | 1/1990 | Janc et al. |
| 5,535,240 A | * | 7/1996 | Carney et al. ............... 375/219 |
| 7,027,942 B1 | * | 4/2006 | Woodard et al. .............. 702/76 |
| 7,532,684 B2 | | 5/2009 | Tietjen |
| 2004/0029548 A1 | * | 2/2004 | Li ............................... 455/307 |
| 2005/0285766 A1 | | 12/2005 | San et al. |
| 2006/0007929 A1 | * | 1/2006 | Desai et al. .................. 370/389 |
| 2007/0080843 A1 | * | 4/2007 | Lee et al. ..................... 341/155 |
| 2008/0036636 A1 | | 2/2008 | Khorram |
| 2009/0115650 A1 | | 5/2009 | Tietjen et al. |

OTHER PUBLICATIONS

International Search Report for related application PCT/US09/30990, dated Feb. 5, 2009.

* cited by examiner

*Primary Examiner*—Rexford N Barnie
*Assistant Examiner*—Joseph Lauture
(74) *Attorney, Agent, or Firm*—Howard IP Law Group, PC

(57) ABSTRACT

An analog to digital converter device including: an input to receive a radio frequency (RF) signal; a plurality of delay elements coupled in series to the input, wherein each element has an output configured to provide the RF signal with a temporal delay corresponding to a different number of the delay elements; a sample rate reduction system having a plurality of inputs each being coupled to a corresponding one of the delay element outputs, and configured to sample the delayed RF signals and provide M-sample outputs, each of the M-sample outputs being sampled at a reduced sampling rate equal to the sampling rate divided by M, M being an integer sample rate reduction value; and an $N^{th}$ order complex bandpass filter coupled to the sample rate reduction system, the complex bandpass filter being configured to filter each of the M-sample outputs to obtain a plurality of complex baseband signals.

8 Claims, 26 Drawing Sheets

DIRECT RF COMPLEX ANALOG TO DIGITAL CONVERTER

FIELD OF THE INVENTION

The present invention relates generally to communication systems, and particularly to digital communication systems.

BACKGROUND OF THE INVENTION

Operations on real signals, such as RF signals, are usually concerned with only the amplitude and phase characteristics of the signal, and not with the information about the carrier signal. In other words, these operations are only concerned with the complex envelope of the signal. Accordingly, a primary objective in signal processing is to extract the complex envelope from the real signal. The complex envelope of the signal of interest may be obtained from the analytic signal via demodulation. As those of ordinary skill in the art will appreciate, the analytic signal is simply the positive frequency component of the real signal. The complex envelope is extracted from the real signal by demodulating the signal to baseband and low-pass filtering the resultant baseband signal. The response of the filter is symmetric about zero. Accordingly, the coefficients are real. The negative frequency components of the signal are eliminated by the filter. This results in an analytic signal at baseband, or the complex envelope of the signal.

In practice, RF signals are typically directed into one or more mixers that down-convert the RF signal into some intermediate frequency (IF). Most modern communication systems employ digital signal processing. Accordingly, after the RF frequency is shifted to the intermediate frequency (IF), one or more analog to digital converters (ADC) are employed to convert the IF analog signal into a digital format.

The IF signal is shifted to baseband (i.e., the center frequency is zero hertz) by further demodulation and filtering. Therefore, the resulting digital data may be digitally demodulated and filtered. The sampling rate may also be reduced. The filtering is designed to attenuate those frequencies or frequency bands which would become aliased to baseband when the sampling rate is reduced. Because the sampling rate cannot be reduced until after the filtering, the demodulator must accommodate high data rates. In high frequency circuits, such as in those implemented in radar systems, analog mixers are typically required to convert the frequency band of interest (BOI) to an IF prior to A to D conversion.

The mixer may be significant in terms of cost, size, and weight. Mixers also raise concerns about electromagnetic interference (EMI) and inter-modulation products. Further, there is also the associated cost of the local oscillator circuitry and timing circuitry.

In one approach, a single chip converter that includes an embedded analog mixer has been considered. However, the process of first mixing, then sampling is the same as the process described above. This approach also requires the local oscillator circuitry and timing circuitry. Some of these single chip converters may operate at relatively high sampling rates, on the order of 1 or 2 GHz. Some devices may operate at frequencies as high as 10-30 GHz. However, this approach has drawbacks. For example, the data provided by these chips is only 4 or 5 bits wide. In practical radar systems, at least 8 to 10 ADC bits are often necessary.

In other approaches, direct RF sampling techniques/architectures have been considered. These approaches are attractive because they seek to eliminate the functionality and limitations of local oscillators (LO) and mixers. However, there are drawbacks to these techniques as well. For large unambiguous instantaneous bandwidths, these techniques often require high ADC conversion rates, nominally over twice the carrier frequency, or the signal bandwidth, to comply with the Nyquist sampling theorem.

What is needed is an approach that directly samples and converts RF signals to baseband without the use of the analog circuitry normally used to mix RF signals prior to A to D conversion. A single device is needed to filter, demodulate, and convert an RF signal to digital format, without the use of mixer or local oscillator circuitry. This approach provides for a reduction in cost, size, weight of radar receivers. Such an approach would increase system reliability because fewer serial components would be required. EMI and inter-modulation product issues, normally associated with mixers, would likewise be eliminated. A single-chip device is needed that would allow slower ADCs to be used when sampling high frequency RF signals, such as X-band signals. A device such as this would accommodate larger digital word sizes because the ADC does operate at the lower rates. As noted above, while some integrated circuits already operate at these rates, the digital word size is relatively small (on the order of 4 or 5 bits).

SUMMARY OF THE INVENTION

An analog to digital converter device including: an input configured to receive a radio frequency (RF) signal having a bandwidth centered at a first frequency; a plurality of delay elements each having an output and coupled in series to the input, wherein each output is configured to provide the RF signal with a temporal delay corresponding to a different number of the delay elements; a sample rate reduction system having a plurality of inputs each being coupled to a corresponding one of the delay element outputs, and configured to sample the delayed RF signals and provide M-sample outputs, each of the M-sample outputs being sampled at a reduced sampling rate equal to the sampling rate divided by M, M being an integer sample rate reduction value; and an $N^{th}$ order complex bandpass filter coupled to the sample rate reduction system, the complex bandpass filter being configured to filter each of the M-sample outputs to obtain a plurality of complex baseband signals.

DETAILED DESCRIPTION OF THE PREFERRED EMBODIMENTS

Figure 1:
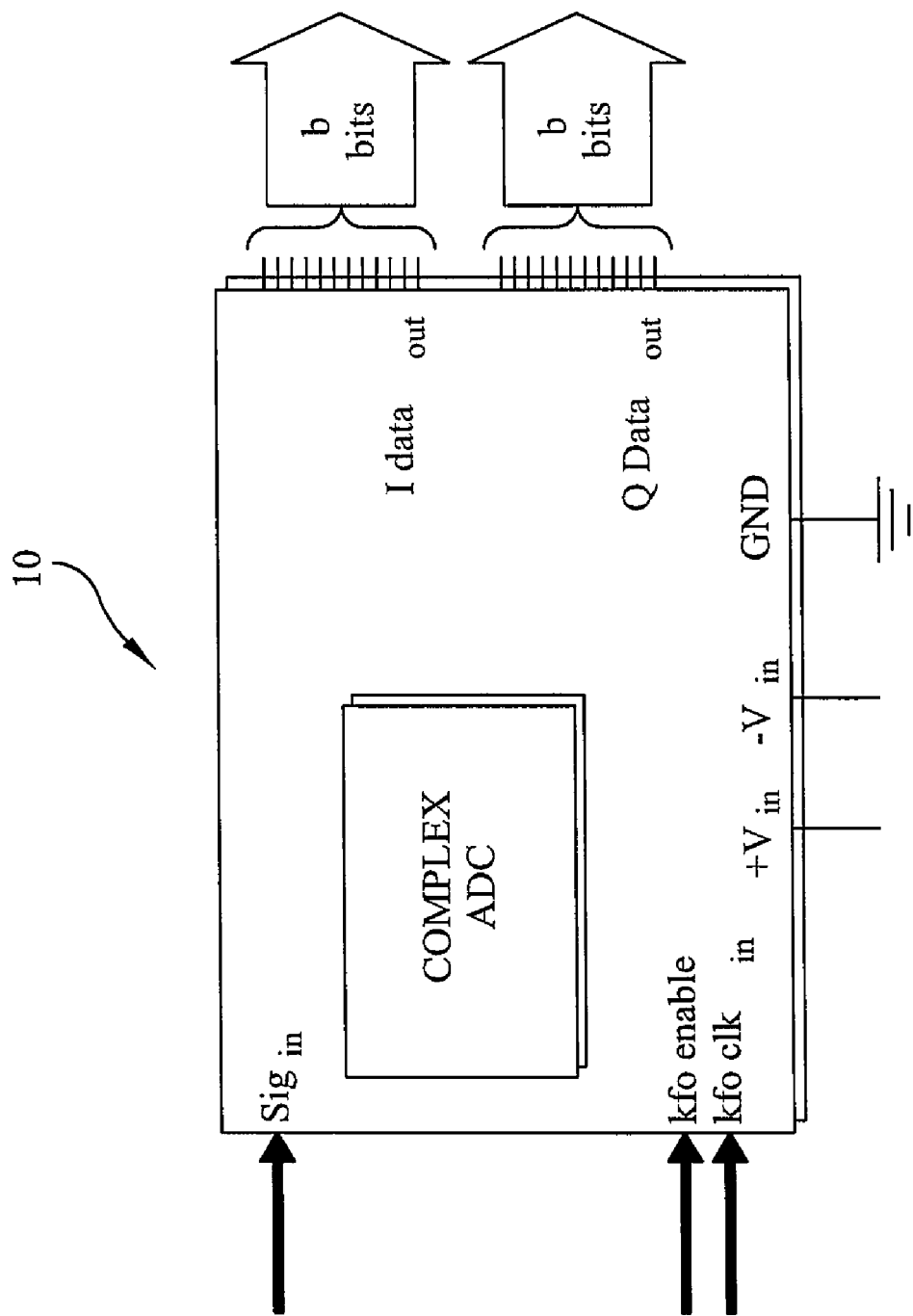
FIG. 1 is a diagrammatic representation of an integrated circuit in accordance with the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the direct radio frequency (RF) complex analog to digital converter (CADC) of the present invention is shown in FIG. 1, and is designated generally throughout by reference numeral 10.

As embodied herein and depicted in FIG. 1, a diagrammatic representation of the CADC integrated circuit in accordance with the present invention is disclosed. The single chip CADC filters, demodulates and converts an RF signal to digital format in a single device, without the use of mixer or local oscillator (LO) circuits. It will be apparent to those of ordinary skill in the pertinent art that modifications and variations can be made to the microelectronic implementation of CADC integrated circuit 10. For example, traditional radio frequency and microwave integrated circuits are typically implemented using either silicon bipolar or gallium arsenide technologies. Further, in other embodiments of the present invention silicon CMOS technology is employed. However, because CMOS transistors are slower than GaAs transistors, the use of CMOS technology may not be feasible at higher RF frequencies.

Radar receivers employing the present invention exhibit reduced cost, size, and weight. The single CADC-IC 10 of the present invention provides an increase in system reliability because fewer serial components are needed in the over-all design. Because mixer circuits are not needed, EMI and inter-modulation product issues normally associated with mixers are eliminated. The CADC will also allow slower ADCs to be used when sampling high RF, such as X-band signals. Even though some integrated circuits already operate at these rates, the digital word size is relatively small (on the order of 4 or 5 bits). The CADC will allow larger digital word sizes (up to 18 bits for example) because the internal analog-to-digital converters (ADCs) operate at lower rates.

The CADC is based on the use of FIR filters with complex coefficients. These can be used to filter and demodulate a sampled signal of arbitrary bandwidth to baseband—without the use of a demodulator or mixer. The CADC uses aliasing to effectively demodulate the signal of interest to baseband, which obviates the complex demodulators which are often used in sampled data systems. For high frequency applications, such as radar, this can eliminate the need for analog mixers often used to mix frequencies to an Intermediate Frequency (IF) prior to analog to digital conversion. Since the conversion rate need only be commensurate with the signal bandwidth, slower ADCs can be used with respect to other direct RF sampling methods. These slower ADCs tend to have more effective number of bits (ENOB) than those which operate at higher rates, resulting in the wider dynamic range often desired in radar applications.

The CADC architecture is more immune to ADC matching errors such as amplitude, phase, and DC offset, which are often encountered with the more traditional time-interleaved ADC arrays. The CADC also reduces the impact of jitter because of its filtering characteristics. The filtering also acts to increase the number of effective bits over that of each ADC.

Figure 2:
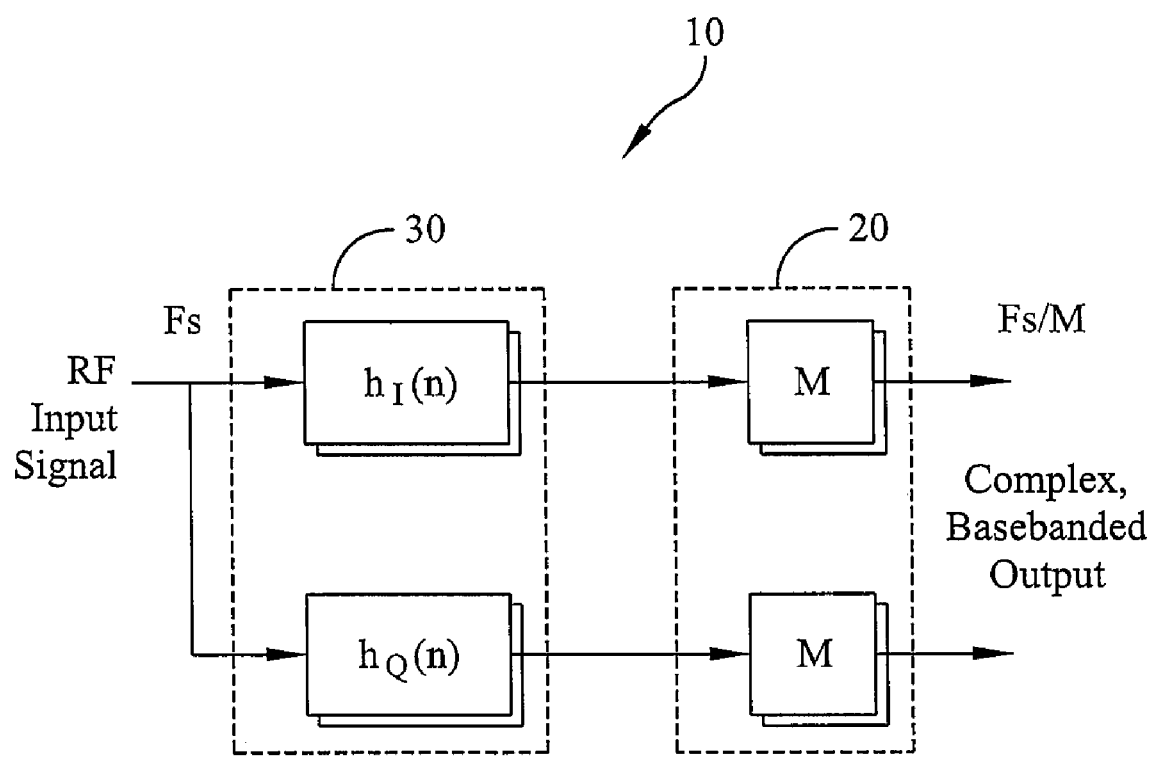
FIG. 2 is a block diagram illustrating a complex FIR filter in accordance with the present invention.

FIG. 2 is a block diagram showing a CADC in accordance with the present invention. CADC 10 includes a complex bandpass filter 30 coupled to sample rate reduction system 20. The output of CADC 10 is a complex baseband digital signal having in-phase and quadrature signal components. The ADCs in the rate reduction system 20 are slower, and therefore accommodate a larger bit size in comparison to ADCs currently used to sample RF. Referring to FIG. 2, CADC 10 does not include any demodulators or mixers. The RF signal is shifted to baseband by simply filtering with a complex filter at the reduced sampling rate to alias the band-of-interest (BOI) to baseband.

The weights for the complex filter are as follows:

$$h(n) * e^{\left(\frac{j2\pi\left(n - \frac{N-1}{2}\right)f_o}{F_s}\right)} \tag{1}$$

where $f_o$ is the center frequency of the BOI, $h(n)$ are the lowpass prototype FIR filter coefficients, and $F_s$ is the sampling rate of the sampled input signal. If the sampling rate is an integer multiple of the BOI center frequency, the BOI becomes aliased (demodulated) to, and centered about, zero frequency. Furthermore, if the sampling rate is specifically 4 times the center frequency, every other coefficient in the resulting complex filter is zero.

FIGS. 3A-3D are diagrams illustrating demodulation in accordance with the present invention. As those of ordinary skill in the art understand, operations on real signals generally concern themselves with only the amplitude and phase characteristics of the signal, and not with the information about the carrier. Therefore, in most cases, only the complex envelope of the signal is of any concern. The complex envelope of the signal of interest is typically obtained from the analytic signal by demodulating the RF input signal.

Accordingly, one of the primary objectives of signal processing relates to the process of extracting the complex envelope from the real signal. In traditional systems, the RF signal is demodulated to baseband. The baseband signal is subsequently filtered by a lowpass filter. Since the lowpass filter is real, the filter response of the low-pass filter is symmetric about zero. As such, the low pass filter provides the analytic signal at baseband. The negative frequency component has been eliminated by the filter.

Figure 3A:
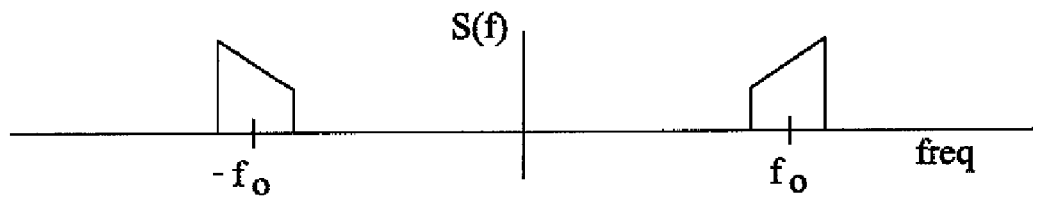
FIGS. 3A-3D are diagrams illustrating demodulation in accordance with the present invention.

FIG. 3A shows the band limited real signal. The analytic signal is simply the positive frequency component of the real signal. The present invention employs a different approach.

Figure 3B:
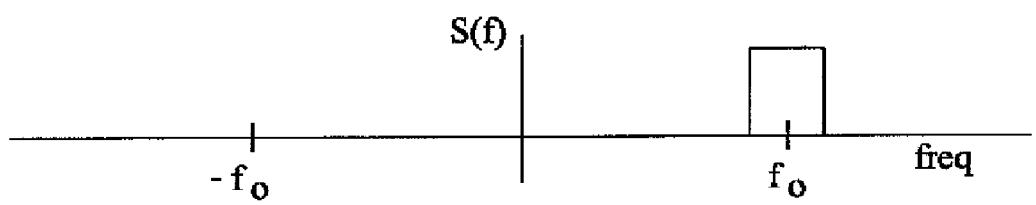

Referring to FIG. 3B, the analytic signal is obtained by passing the real signal through a Hilbert Transformer. The Hilbert Transform is an all-pass filter which imparts a $-90°$ phase shift to the positive frequency components of a real signal. However, further filtering must be performed to obtain the analytic portion of only the signals in the band of interest. Thus, the present invention combines the all-pass Hilbert Transform with a complex FIR filter.

Figure 3C:
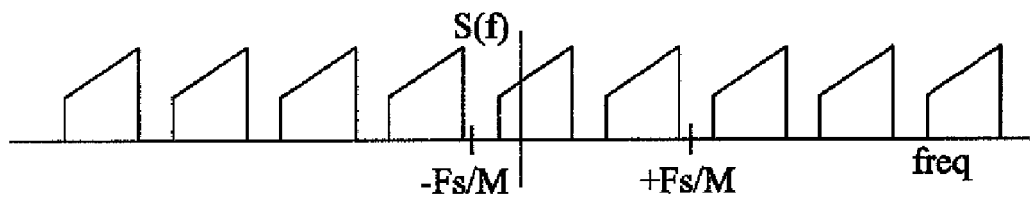

FIG. 3C illustrates the demodulation of the filtered signal to baseband. As shown, this step yields the complex envelope of the signal. Demodulation is performed by reducing the sampling rate by an amount sufficient to alias the analytic signal to baseband. As shown, the center of the BOI will not reside exactly at zero, unless the sampling rate is an integer multiple of the center frequency ($f_o$). However, the entire BOI is disposed within the final processing band from $-F_s/M$ to $+F_s/M$, where M is the sampling rate reduction ratio.

The locations of the original frequencies in the BOI after sample rate reduction has occurred can be determined from the following formula:

$$f_A = f_{in} - \frac{F_s}{M} \text{INT}\left[\frac{Mf_{in}}{F_s}\right] \tag{2}$$

where, $f_{in}$ is the original input frequency of interest, $f_A$ is the frequency into which $f_{in}$ becomes aliased, $F_s$ is the Initial sampling rate, M is the sampling rate reduction ratio, and INT[ ] is the integer part of the expression within the brackets [ ]. Conversely, the input frequencies which become aliased into a given alias frequency can be determined from equation (3):

$$f_{in_k} = f_A + \frac{kF_s}{M}; k = 0,1,2,\ldots, M-1 \tag{3}$$

As noted previously, a complex Finite Impulse Response (FIR) filter is employed by the present invention to filter and demodulate a signal to baseband without the use of demodulators or mixers. The order of a FIR filter may be approximated by:

$$N = \frac{-10 \text{Log}_{10}(\delta_1 \delta_2) - 13}{14.6 \Delta f} + 1 \tag{4}$$

where, $\Delta f$ is the normalized transition bandwidth, $\delta_1$ is the passband ripple, and $\delta_2$ is the stopband ripple.

Figure 3D:
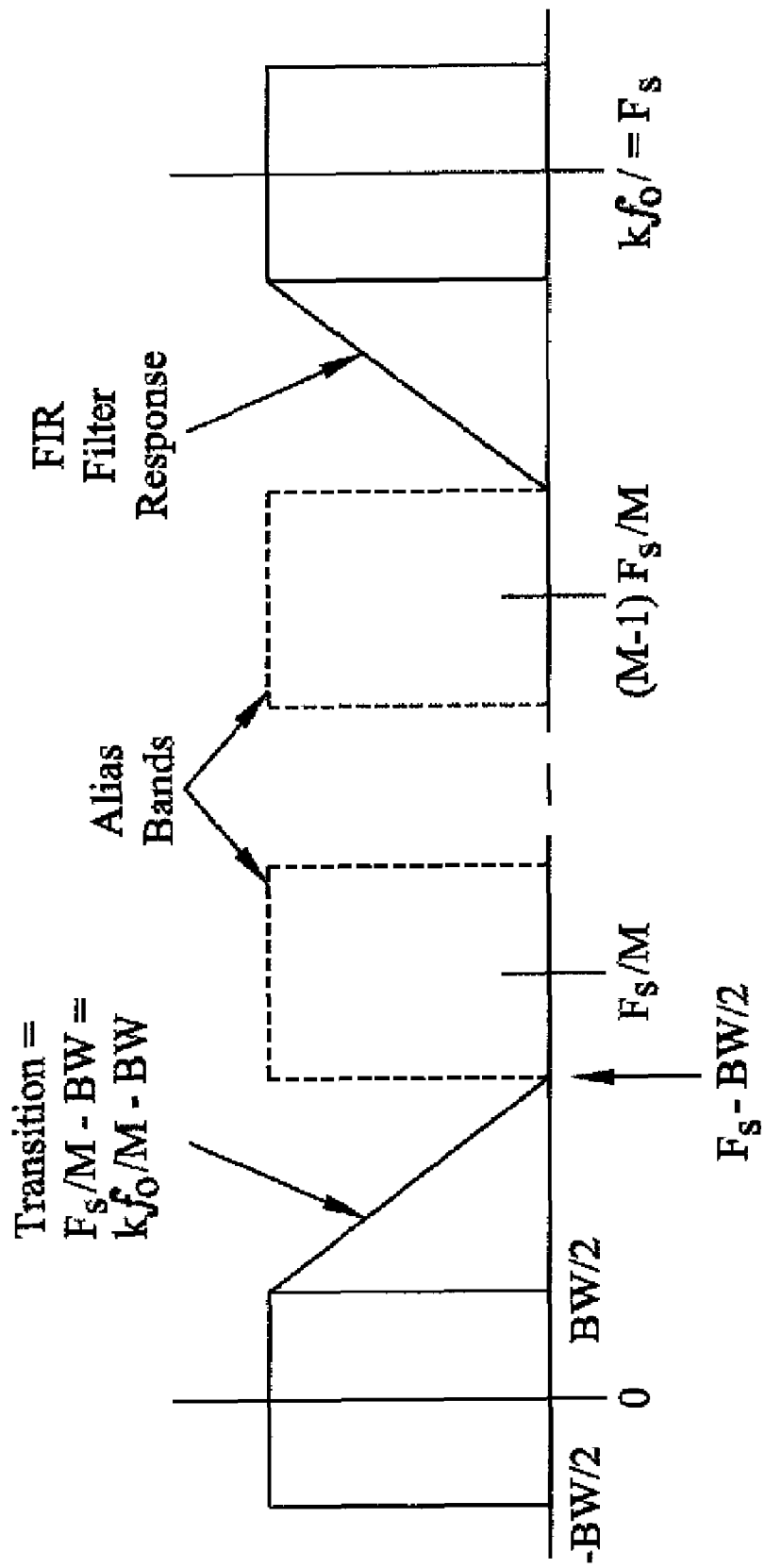

Referring to FIG. 3D, $\Delta f$ may be written in terms of $kf_o$, BW, M, and Fs as:

$$\Delta f = \frac{F_s 1M - BW}{kf_o} = \frac{kf_0 1M - BW}{kf_o} = \frac{1}{M} - \frac{BW}{kf_o} \tag{5}$$

When equation (5) is plugged into equation (4), the following expression for the FIR filter order is obtained:

$$N = \frac{-10 \text{Log}_{10} - (\delta_1 \delta_2) - 13}{14.6\left[\frac{1}{M} - \frac{BW}{kf_o}\right]} + 1 \tag{6}$$

Those skilled in the art will understand that a limit is implied on the sampling rate reduction ratio (M). The sampling rate cannot be reduced from $kf_o$ to less than BW. This would violate the Nyquist criteria for complex sampling. This limit can be expressed as:

$$M_{max} \leq \frac{kf_o}{BW} \tag{7}$$

When k is set equal to four (4), every other filter coefficient is zero. For certain circumstances, this is a desirable result. Under these circumstances, the expression for N reduces to:

$$N = \frac{1}{\left[\frac{1}{M} - \frac{BW}{4f_o}\right]} + 1 \tag{8}$$

where $$M \leq \frac{4f_o}{BW}$$

Accordingly, the complex FIR filter is employed to filter and shift a real bandlimited RF signal to baseband by simply reducing the sampling rate. The down conversion occurs by aliasing the RF signal to baseband.

Figure 4:
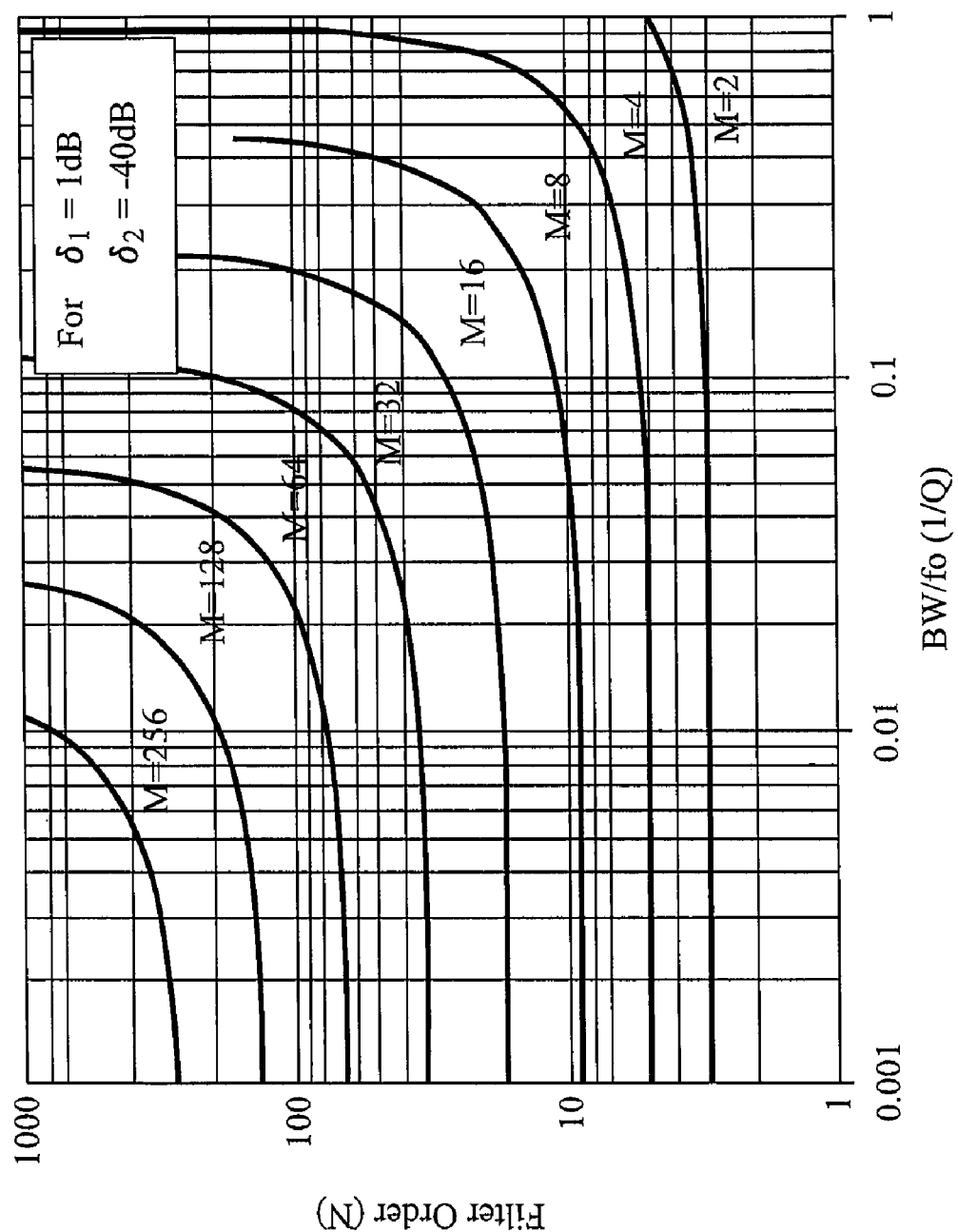
FIG. 4 is a chart showing Filter order vs. Normalized Bandwidth for Various Sampling Rate Reduction Ratios (M)

Referring to FIG. 4, equation (6) is plotted for an in-band ripple of 1 dB, and 40 dB of alias protection (stopband attenuation). FIG. 4 is a plot of filter order, N, vs. BW/$f_o$ for a k of 4 and for various M. Note that in accordance with [1], a k of 4 results in every other filter coefficient being zero.

Figure 5A:
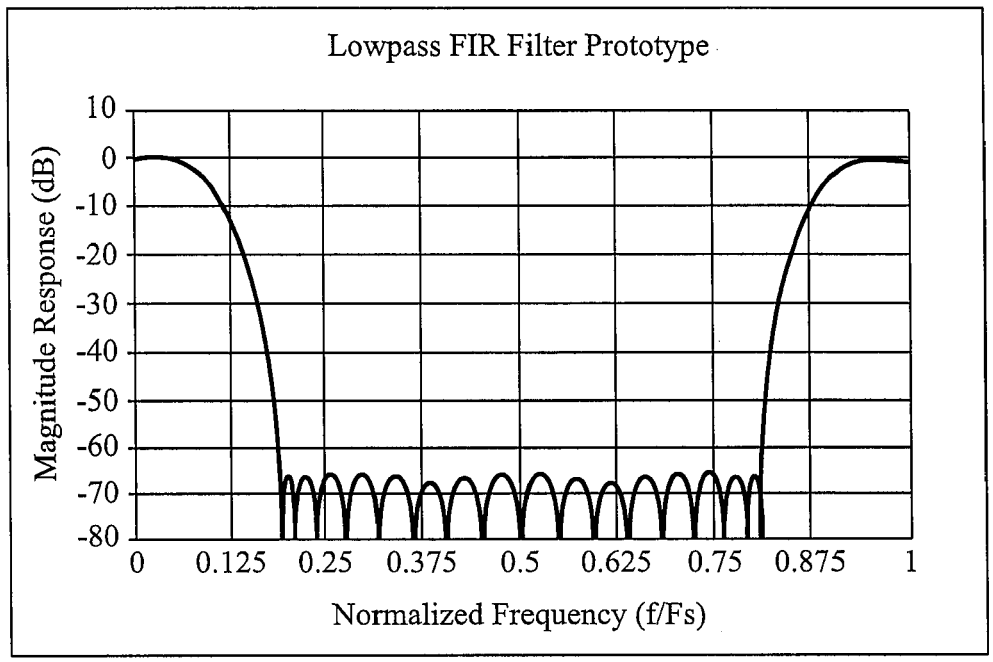
FIG. 5A is a chart showing the frequency response of a low pass FIR filter.
Figure 5B:
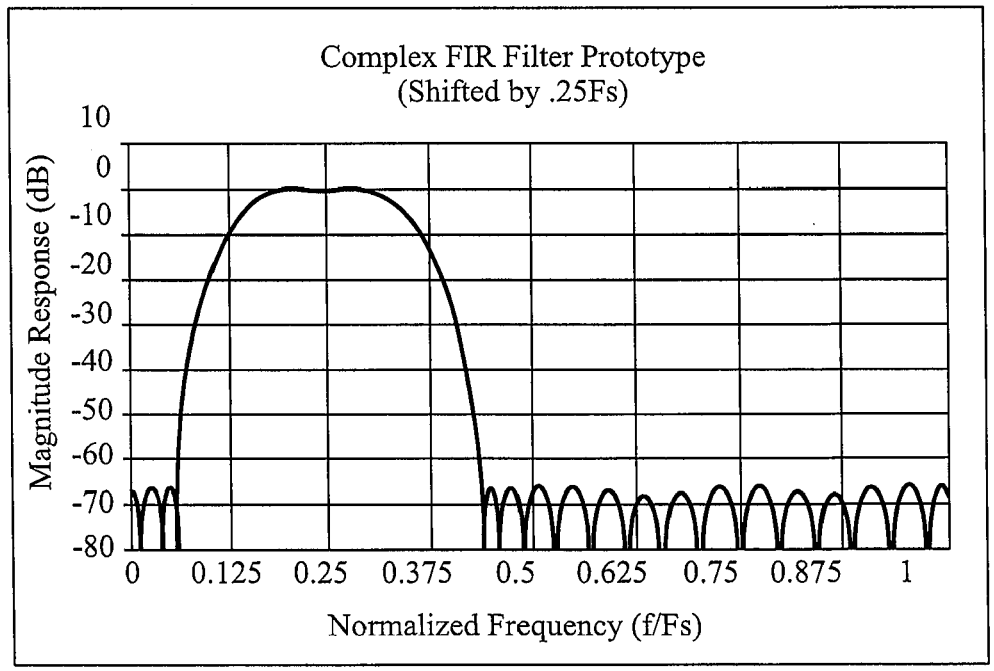
FIG. 5B is a chart showing the frequency response of a complex FIR filter.

FIG. 5A is a chart showing the frequency response of a low pass FIR filter. FIG. 5B is a chart showing the frequency response of a complex FIR filter. Equation (1) provided above provides an expression of the weights of a complex FIR filter. Those of ordinary skill in the art will understand that when this expression is multiplied by a lowpass filter weight, the frequency spectrum is shifted.

Figure 6A:
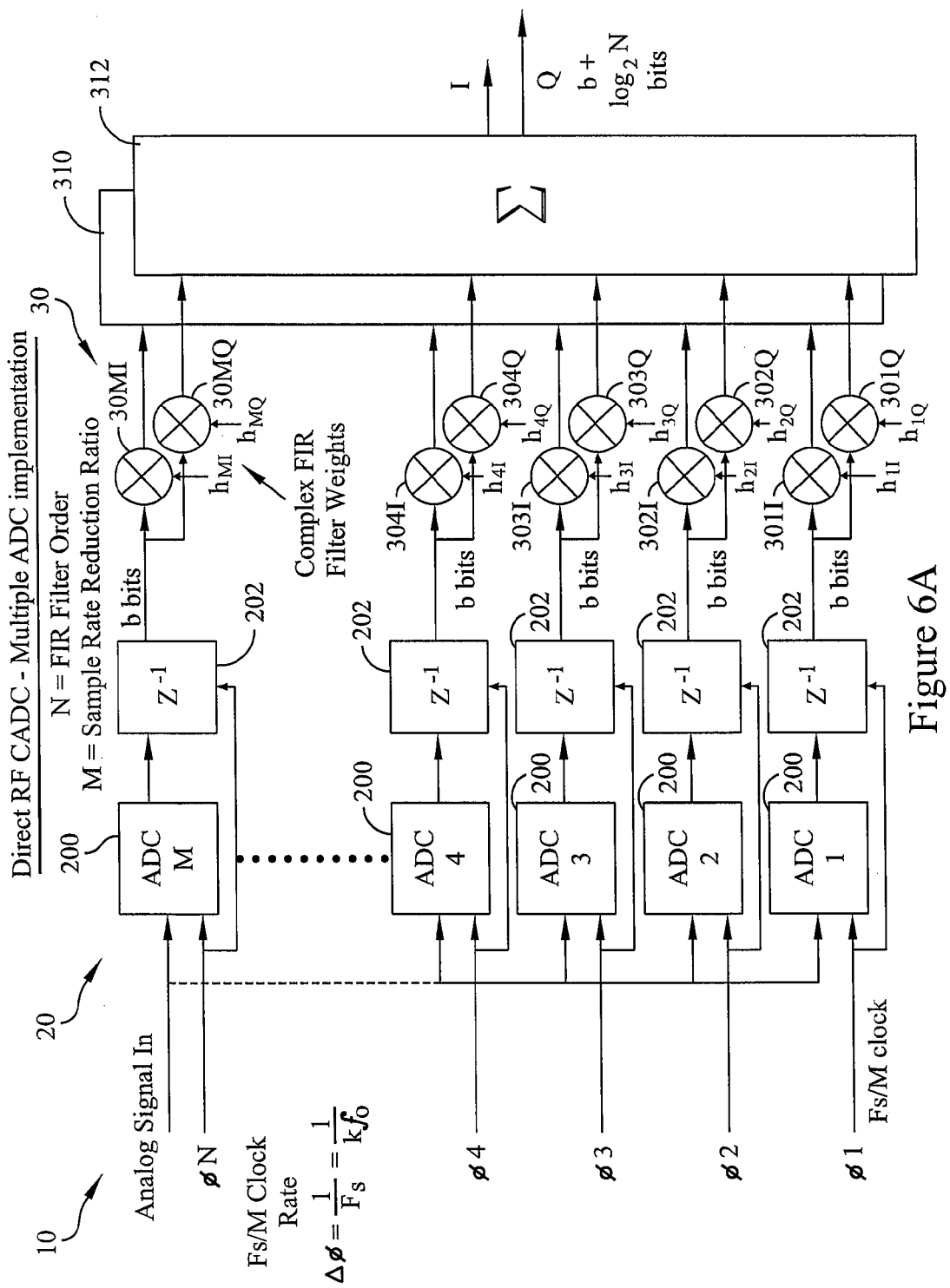
FIG. 6A is a block diagram of a direct RF complex analog-to-digital converter (CADC) in accordance with a first embodiment of the present invention.

As embodied herein and depicted in FIG. 6A, a block diagram of a direct RF complex analog-to-digital converter (CADC) 10 in accordance with a first embodiment of the present invention is disclosed. CADC 10 includes rate reduction system 20, which is comprised of M low speed analog to digital converters (ADCs) 200, M being an integer number. Each ADC is coupled to register 202. Each register 202 is coupled to an in-phase multiplier (301-I . . . 30M-I) and a quadrature multiplier (301-Q . . . 30M-Q). The digital values are multiplied by a complex filter weight as given by equation (1). The digital sample equals "b" bits of sampled data, "b" being an integer number. Typically, "b" is 8 bits or greater, but depends upon the state-of-the-art and the sampling rate. In-phase multipliers 301-I . . . 30M-I are coupled to summer circuit 310. Quadrature multipliers 301-Q . . . 30M-Q are coupled to summer circuit 312.

The device of FIG. 6A operates as follows. The carrier frequency $f_o$ of the RF is typically in the gigahertz range. In one embodiment, the device is employed in an X-band system having a carrier frequency of approximately 9.0 GHz. The RF signal has a signal bandwidth BW. The initial effective sampling rate $F_s$ functions as the system clock, and is equal to $kf_o$, where k is an integer. The $kf_o$ clock input is shown in FIG. 1. A clock phase circuit, not shown in FIG. 6A, generates N-phase clocks. The time delay between the rising edge of adjacent phase clock pulses is, of course, the reciprocal of the initial effective sampling rate $F_s$. However, while the RF signal is sampled at the effective sampling rate $F_s$, each phase clock causes its corresponding ADC 200 to sample the RF signal at a rate equal to $F_s/M$. Accordingly, the phase clocks have different phases, i.e., are time interleaved such that the M-ADCs sequentially sample and output a digital sample that, when taken together, represent the RF waveform being sampled at a rate commensurate with the carrier frequency. However, by employing N-phase clocks that sample at a rate equal to $F_s/M$, relatively low-speed ADCs may be employed, simplifying the circuit design. A complex FIR filter is implemented by weighting and summing the ADC outputs.

The number of ADCs is equal to the sample rate reduction ratio, M, to be implemented. As described previously, the aliasing functionality implemented in the present invention serves to demodulate, or mix, the band of interest to baseband. Note that all ADC output must be stored in register 202 in order to allow each ADC to have the full sample period (M/$F_s$) for analog to digital conversion.

The in-phase and quadrature outputs of summer 310, 312 may be directed into a digital signal processor (DSP) for further processing. For example, the DSP may further reduce the sampling rate, and additional filtering may be performed as well. The filtering may further attenuate those frequencies or frequency bands which would become aliased to baseband when the sampling rate is reduced.

Figure 6B:
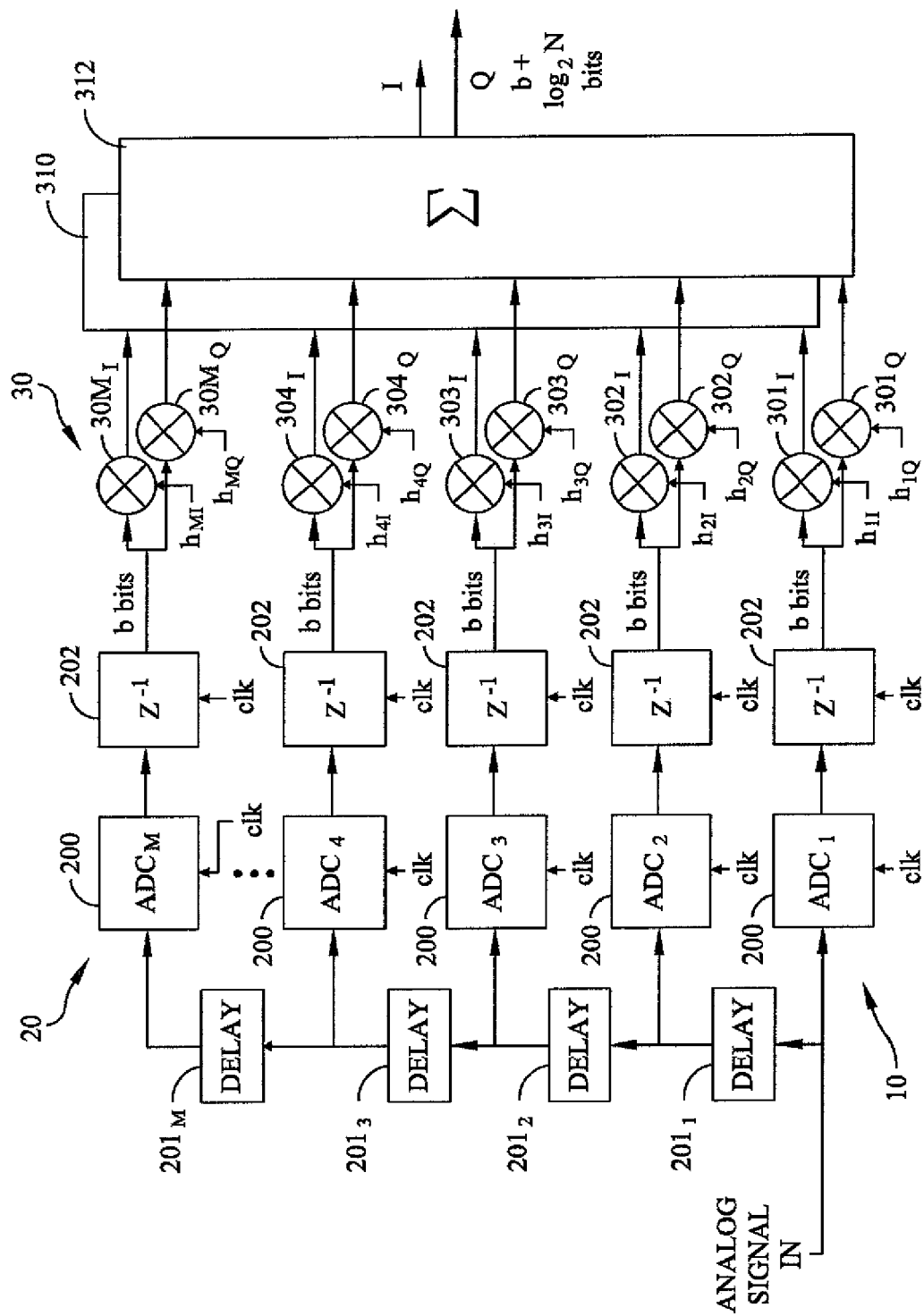
FIG. 6B is a block diagram of a direct RF complex analog-to-digital converter (CADC) in accordance with a first embodiment of the present invention.

FIG. 6B illustrates a block diagram of a direct RF complex analog-to-digital converter (CADC) 10 in accordance with another embodiment of the present invention. Like FIG. 6A, CADC 10 of FIG. 6B again includes rate reduction system 20, which is comprised of M low speed analog to digital converters (ADCs) 200, M being an integer number. Each ADC is again coupled to a register 202. Each register 202 is again coupled to an in-phase multiplier(301-I . . . 30M-I) and a quadrature multiplier (301-Q . . . 30M-Q). The digital values are multiplied by a complex filter weight as given by equation (1). The digital sample equals "b" bits of sampled data, "b" being an integer number. Typically, "b" is 8 bits or greater, but depends upon the state-of-the-art and the sampling rate. In-phase multipliers 301-I . . . 30M-I are coupled to summer circuit 310. Quadrature multipliers 301-Q . . . 30M-Q are coupled to summer circuit 312.

Differently, the embodiment of FIG. 6B includes a plurality of delay elements 201, each having an output and coupled in series to the RF signal input, wherein each delay 201 output is configured to provide the inputted RF signal with a temporal delay corresponding to a different number of the delay elements. For example, $ADC_2$ receives the input RF signal with a delay corresponding to the temporal delay introduced by $DELAY_1$. $ADC_3$ receives the input RF signal with a delay corresponding to the temporal delay introduced by $DELAY_1$+$DELAY_2$. $ADC_4$ receives the input RF signal with a delay corresponding to the temporal delay introduced by $DELAY_1$+$DELAY_2$+$DELAY_3$. And, $ADC_M$ receives the input RF signal with a delay corresponding to the sum of the temporal delays of all of the upstream delay elements 201.

By delaying the RF signals input to the ADCs 200 relative to one another, a common clock signal CLK may be used in lieu of phased clock signals $\phi1$-$\phi N$. This may advantageously allow for a conventional integrated circuit that incorporates multiple ADCs but uses only a single clocking input to be used.

Each delay element 201 may take any suitable form, such as an analog delay line to provide a temporal skew, such as a predetermined length of cabling, for example. By way of non-limiting example only, where a 100 MHz clock is used for ADC's 200, roughly 10 nanoseconds may elapse between samples. In such a case, it may be desirable to introduce an about 2 nanosecond delay with each delay element 201. A predetermined length of cabling, such as about 2 feet for example, may be used to provide such a delay. Alternatively, sample and hold circuitry analogous to that described hereinbelow clocked to integer phases of a clock signal, as is described in connection with FIG. 6A, may be used.

Figure 7A:
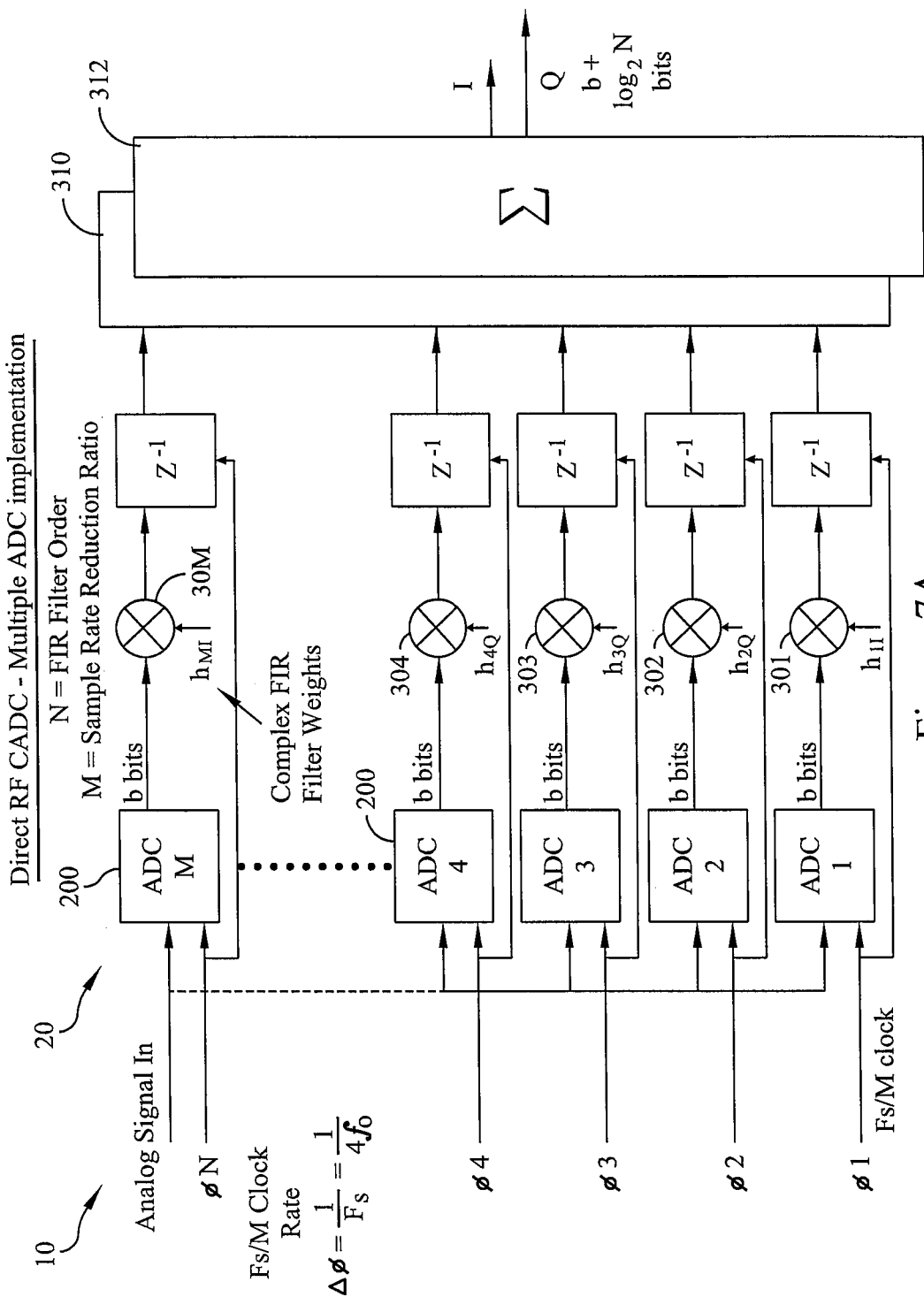
FIG. 7A is a diagram of the CADC shown in FIG. 6 when the CADC input clock is set at four times the RF carrier frequency.

Referring to FIG. 7A, a modified diagram of the CADC shown in FIG. 6A is shown. In this embodiment, the CADC input clock is set at four times the RF carrier frequency. The registers 202 are placed at the output of the filter multipliers 301-30M. The registers may be placed at the multiplier output in the embodiment shown in FIG. 6A, as well. When k is set equal to four (4), every other FIR filter coefficient will be zero. This reduces the number of multipliers by a factor of two.

Figure 7B:
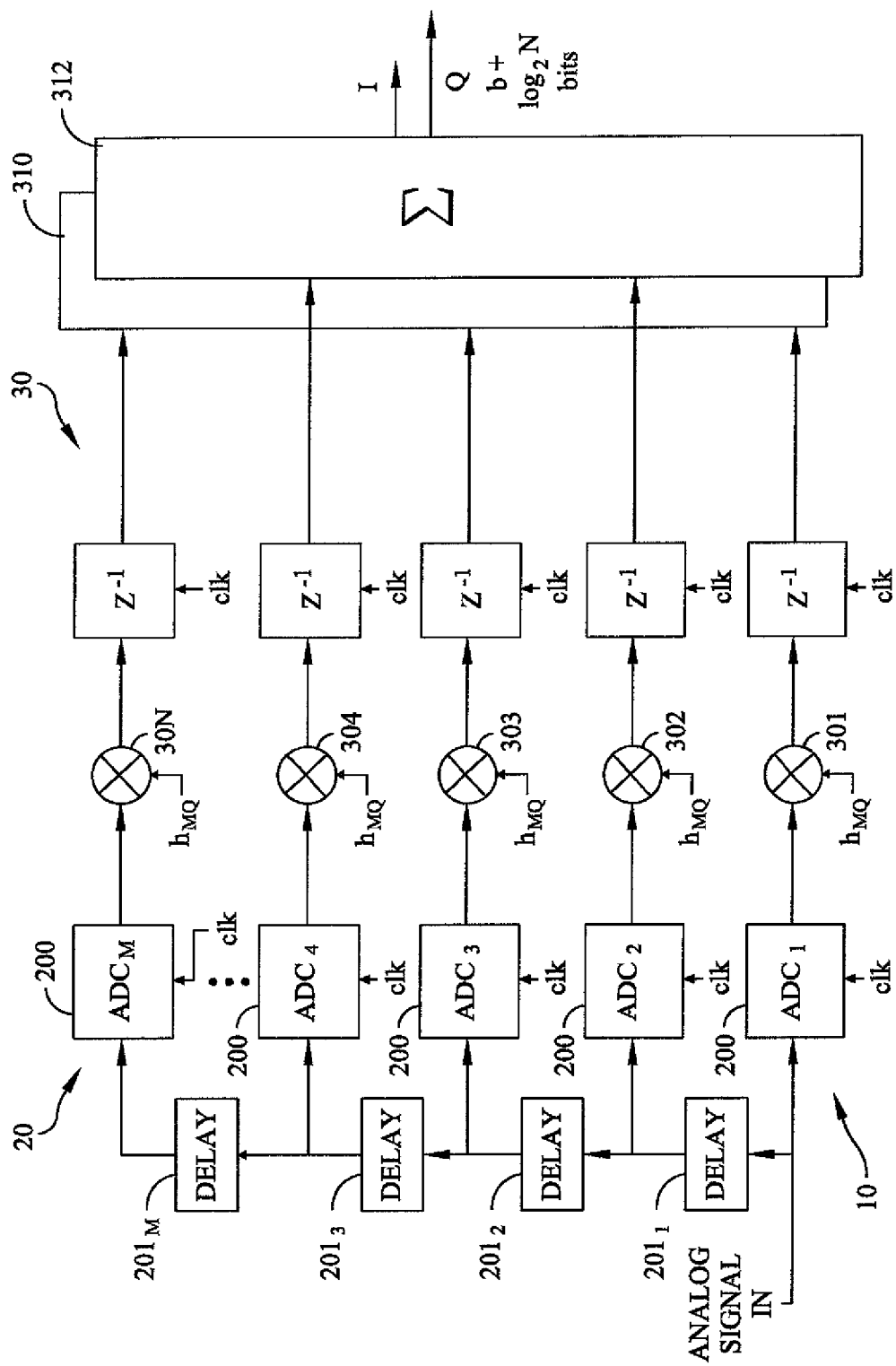
FIG. 7B is a diagram of the CADC shown in FIG. 6 when the CADC input clock is set at four times the RF carrier frequency.

Referring now also to FIG. 7B, a corresponding modified diagram of the CADC shown in FIG. 6b is shown. Again, the CADC input clock is set at four times the RF carrier frequency. The registers 202 are placed at the output of the filter multipliers 301-30M. The registers may be placed at the multiplier output in the embodiment shown in FIG. 7A, as well. When k is set equal to four (4), every other FIR filter coefficient will be zero. This reduces the number of multipliers by a factor of two. Also again, by delaying the RF signals input to the ADCs 200 relative to one another, a common clock signal CLK may be used in lieu of phased clock signals $\phi1$-$\phi N$. This may advantageously allow for a conventional integrated circuit that incorporates multiple ADCs but uses only a single clocking input to be used.

Figure 8:
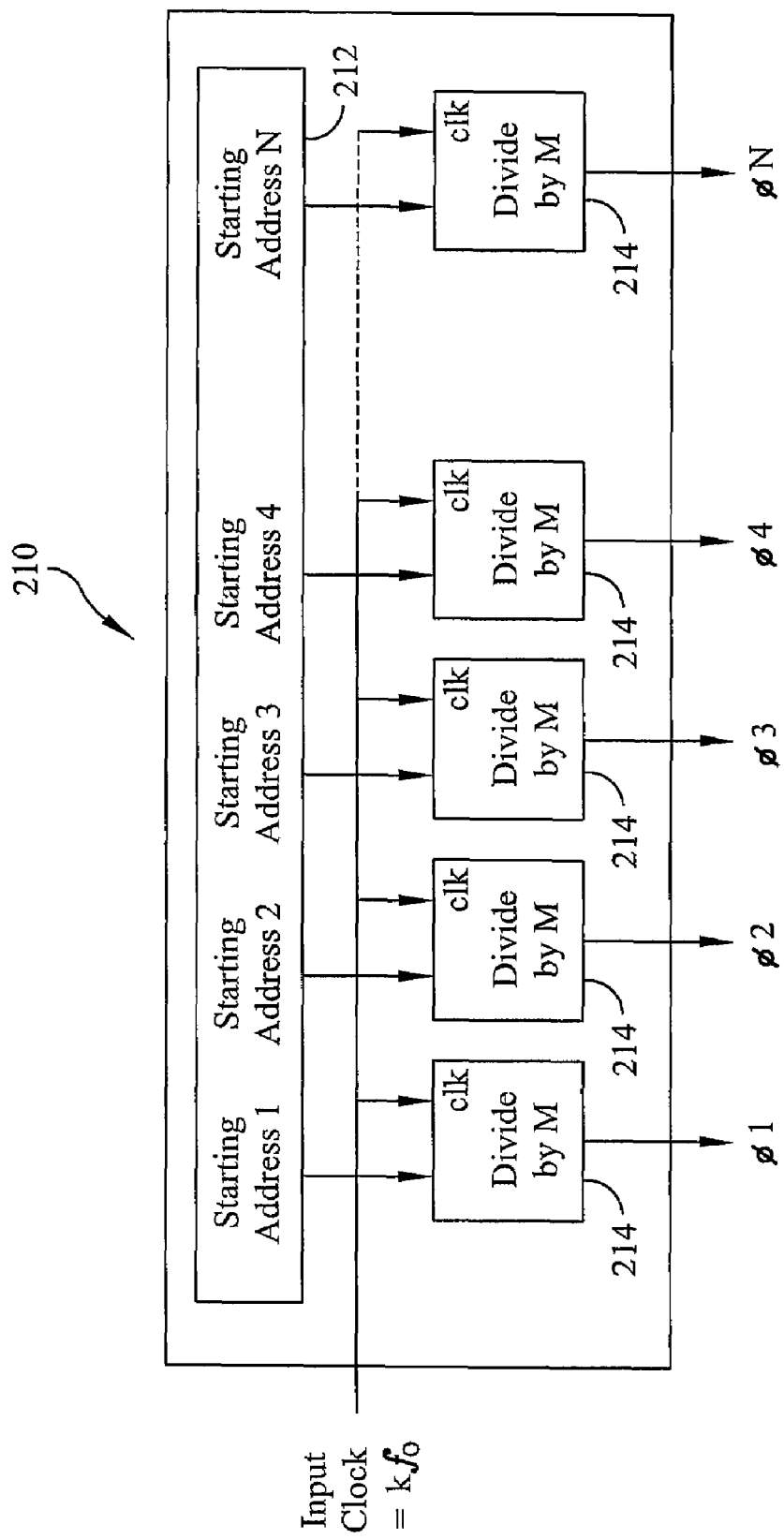
FIG. 8 is a detailed block diagram of the phase clock generator.

FIG. 8 is a detailed block diagram of the phase clock generator. The phase clock generator 210 is implemented using address circuit 212 and M-divide by M circuits. In one embodiment, the address circuit increments from, i.e. binary 000 to 111 (in the case where M=8). Of course, the addressing may be adjusted depending on the value of M, or if there are additional registers 202 that may need to be clocked. However, such adjustments are well within the skill of those of ordinary skill in the art. The addressing circuit also includes additional gating logic such that the first divide by M circuit is only enabled when address is "000." The next divided by M circuit is only enabled when the address equals "001." The count increments until each divide by M circuit is enabled. The divide by M circuit may be implemented as a flip-flop. If the address enable is high, the input clock latches the high input and a single clock pulse is directed to the flip-flop output. Accordingly, one clock pulse is synchronously output by one and only one divide by M circuit for each clock period of $F_s$. Those skilled in the pertinent art will recognize that there are many ways of implementing phase clock generator 210, including implementations which employ analog delay lines to provide the appropriate clock time skew. The above description being mere a representative example of one implementation.

Figure 9:
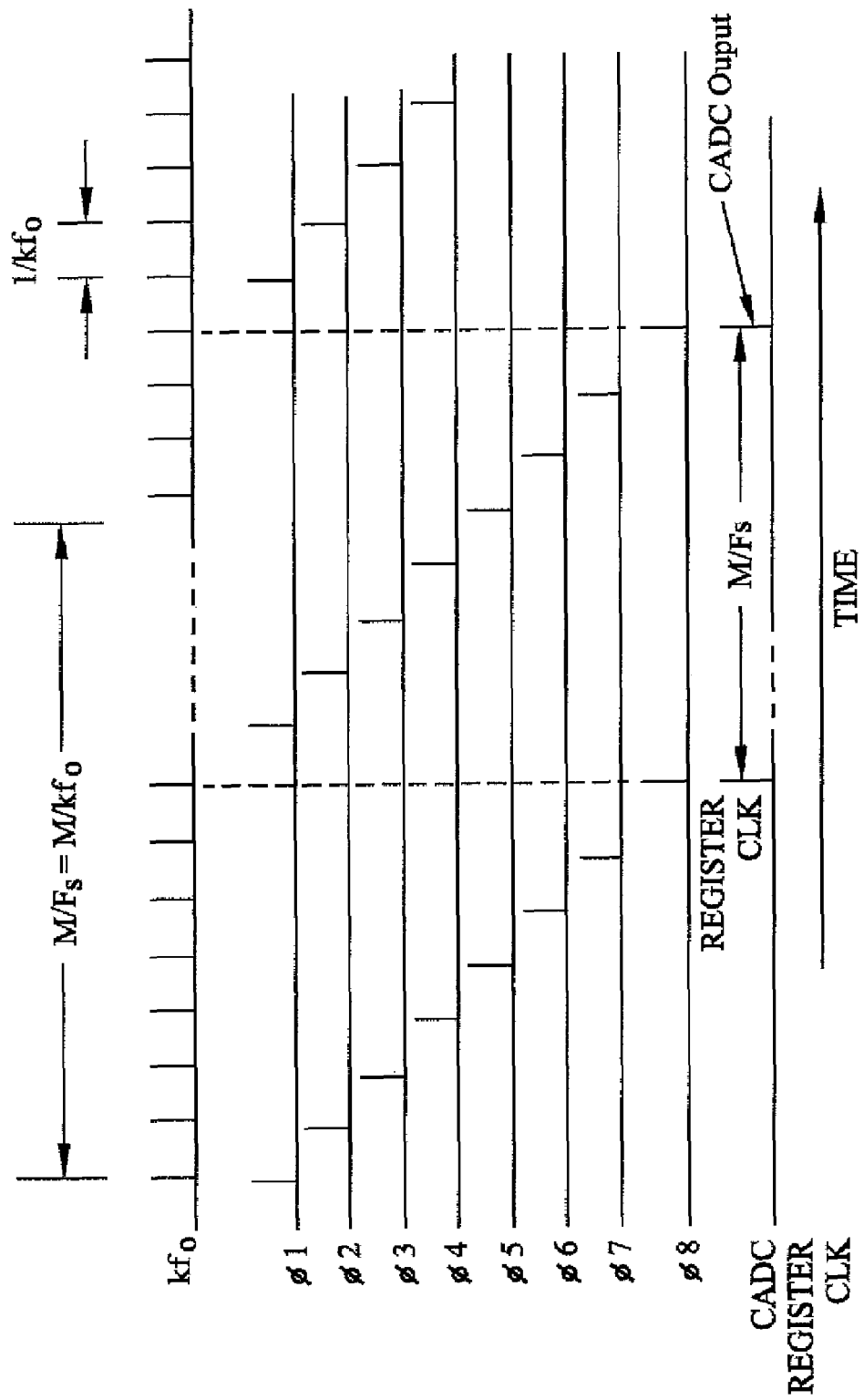
FIG. 9 is a chart showing CADC timing.

FIG. 9 is a chart showing CADC timing. FIG. 9 provides a graphical illustration of the relationship of input clock $kf_0$ and each of the phase clocks Φ1-Φ8). FIG. 9, of course, shows an implementation wherein M=8. As shown, there are eight phase clock pulses and an additional clock pulse to latch registers 202. The sample period for each phase clock is $M/kf_0$, which is M times the effective sample period of the input clock. CADC 10 also includes an output buffer configured to store the in-phase and quadrature digital signals (not shown in FIG. 6 or FIG. 7). Phase clock circuit 210 may be employed to latch this buffer circuit as well.

Figure 10:
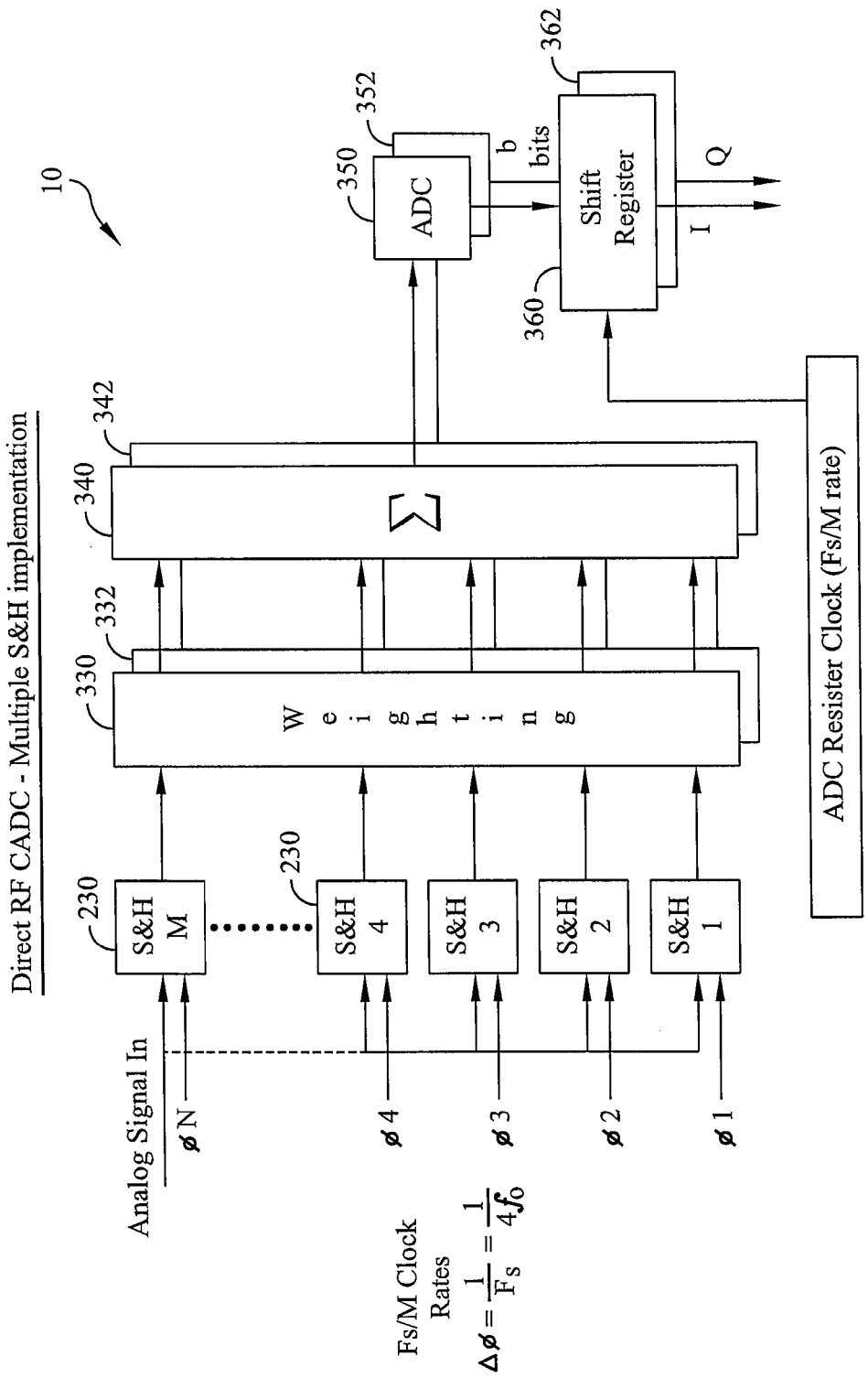
FIG. 10 is a block diagram of a direct RF complex analog-to-digital converter (CADC) in accordance with a second embodiment of the present invention.

As embodied herein and depicted in FIG. 10, a block diagram of a direct RF complex analog-to-digital converter (CADC) in accordance with a second embodiment of the present invention is disclosed. In this embodiment, the low speed ADCs are replaced by sample and hold circuits 230. The timing of the sample and hold circuits is identical to the timing employed by the low speed ADCs shown in FIG. 6 and FIG. 7. On the other hand, sample and hold circuits 230 do not provide a digital output word. The sample and hold circuit merely samples the amplitude of the RF signal when enabled by its corresponding phase clock. Subsequently, the sampled analog output is multiplied by a complex coefficient value stored in the weighting circuits 330, 332. Weighting circuit 330 provides in-phase analog signal samples and weighting circuit 332 provides quadrature analog signal values. The in-phase signals are summed by summer circuit 340. The quadrature signals are likewise summed by summer circuit 342. The summed analog in-phase signals are converted into digital values by directing the signals into low speed in-phase ADC 350. In similar fashion, the summed analog quadrature signals are converted into digital values by directing the quadrature signals into low speed quadrature ADC 352. Finally, the in-phase digital baseband signal is clocked into shift register 360 and the quadrature baseband bit stream is clocked into register 362.

The sampling rate is reduced to clock either the sample and hold circuits 230 or ADCs 200 at a rate commensurate with the signal bandwidth. In these architectures, the sampling rate is reduced by a factor at least equal to the size of the FIR filter. Otherwise, events will overlap. For example, the ADCs (or S&Hs) are clocked at $1/kf_o$. The cycle time through all the FIR filter taps would then be $N/kf_o$. This cycle is then repeated at a rate $M/kf_o$. In this case the following inequality must be satisfied:

$$N/kf_o \leq M/kf_o \quad (9)$$

$$\text{Therefore, } N \leq M \quad (10)$$

Accordingly, N can be no larger than the sample rate reduction ratio, M. This constraint places limitations on the amount of filtering that can be achieved, specifically to reduce aliasing for the architecture previously described.

Assuming that the narrowest bandwidth filter that can be implemented is a Sinc FIR filter (i.e., a filter whose coefficients are all equal), then a simple analysis can be performed to determine the alias protection that the CADC can provide. The frequency response of a Sinc filter can be written as:

$$H(f) = \frac{\sin(\pi Nf)}{\pi Nf} \quad (11)$$

Figure 11:
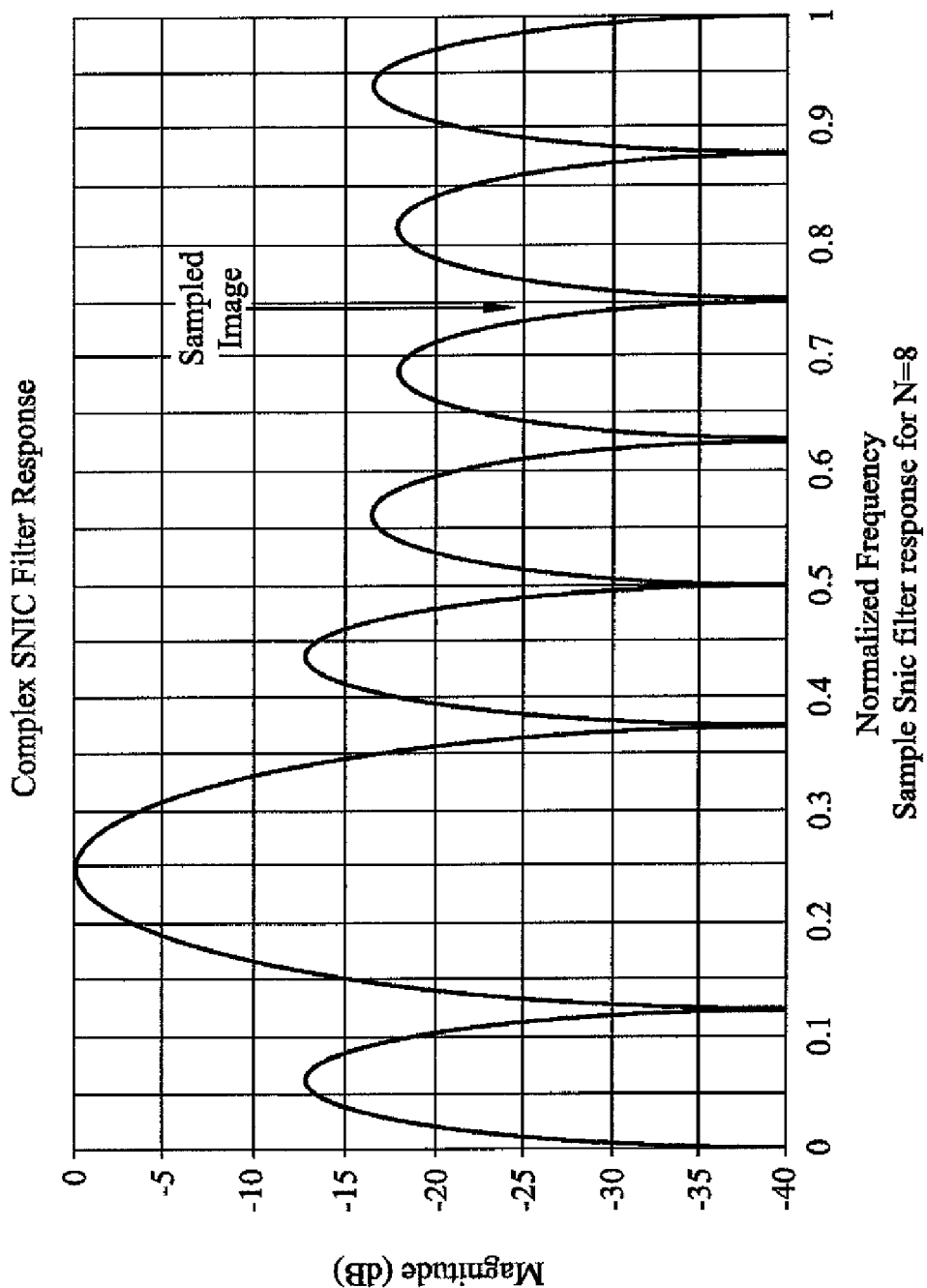
FIG. 11 is a chart illustrating the frequency response of a complex SNIC FIR filter.

For a sampled data system, the actual response is the summation of an infinite number of Sinc functions spaced at the sampling rate. This response is given in [18] as:

$$H(f) = \frac{\sin(\pi Nf)}{N \sin(\pi f)} \quad (12)$$

and is often referred to as a "Snic" function, and is plotted in FIG. 11 for N=8.

Figure 12:
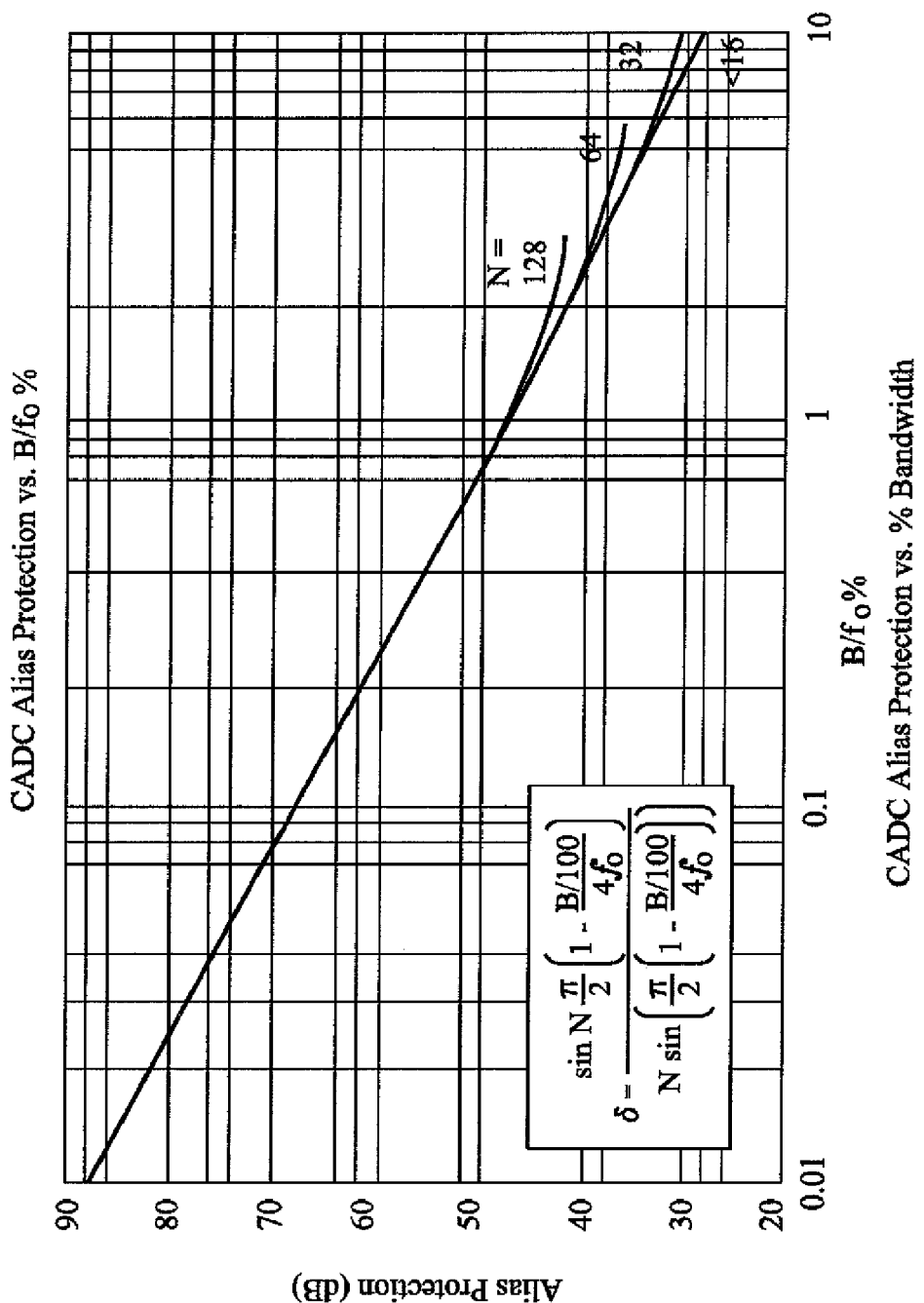
FIG. 12 is a chart showing CADC aliasing protection.

Referring to FIG. 12, a chart showing CADC aliasing protection is shown. In the CADC architecture, if it is assumed that the sampling rate is 4 times the frequency of interest, then the sampled image will also occur at 0.75 times the sampling rate Fs. The snic function has a zero at 0.75 Fs, so images around this will experience attenuation. This attenuation will correspond to the alias protection the filter will provide. If B is the bandwidth of the signal of interest, then the minimum amount of attenuation, δ, will correspond to the frequency of ±B/2 away from 0.75 Fs. This is equivalent to being ±B/2 away from 0.5 Fs in the lowpass filter prototype and can be expressed as:

$$\delta = \frac{\sin\left[N\frac{\pi}{2}\left(1 - \frac{B}{F_s}\right)\right]}{N\sin\left[\frac{\pi}{2}\left(1 - \frac{B}{F_s}\right)\right]} \quad (13)$$

where δ=Attenuation of alias image at band edges, B is the signal Bandwidth, $F_s$ is the sampling rate, and N is the order of the filter. Normalized to the signal frequency, $f_o$, the attenuation becomes:

$$\delta = \frac{\sin\left[N\frac{\pi}{2}\left(1 - \frac{B}{kf_o}\right)\right]}{N\sin\left[\frac{\pi}{2}\left(1 - \frac{B}{kf_o}\right)\right]} \quad (14)$$

Equation 14 is plotted in FIG. 12 for various filter orders, with k=4, as a function of percent bandwidth of the signal frequency. As shown by equation (14), frequency characteristics are related to the sampling rate. The location of the alias image null (0.75 Fs) may be selected by properly selecting the sampling rate. Selecting the null to correspond to the instantaneous signal frequency yields benefits. The instantaneous bandwidth of the signal is often quite narrow when compared to the operational band. In radar systems this allows frequency hopping of the signals. By localizing on the instantaneous frequencies, more alias image protection would be provided than if the entire operational bandwidth were used. A signal bandwidth of 5 MHz with frequency of 450 MHz (UHF) for example, represents about a 1% bandwidth to frequency ratio. FIG. 12 shows that this technique provides at least 48 dB of alias image rejection.

Errors may be introduced from several sources. These errors include ADC offset and mismatch error, timing jitter, and quantization. The ADC mismatch includes both amplitude and phase mismatch, and will in general impact the frequency response of the CADC FIR filter. Timing jitter basically results in an increase in the ADC noise floor, and may impact ADC dynamic range and system clutter cancellation performance. Offset differences and mismatches in the ADC may also impact performance. In the more typical time-interleaved ADC architectures, the output of each ADC is multiplexed to construct a signal sampled at the higher Es rate. ADC mismatch error may produce spurious artifacts in the output spectrum because the mismatch errors will tend to repeat as the array of ADCs are cycled through. However, in the present invention, ADC amplitude and phase mismatches do not cause spectral artifacts because the errors are lumped together in the filter output. Instead, the mismatches may manifest themselves as perturbations to the frequency response of the FIR filter. The net result will be a somewhat different frequency response than what was expected.

Figure 13:
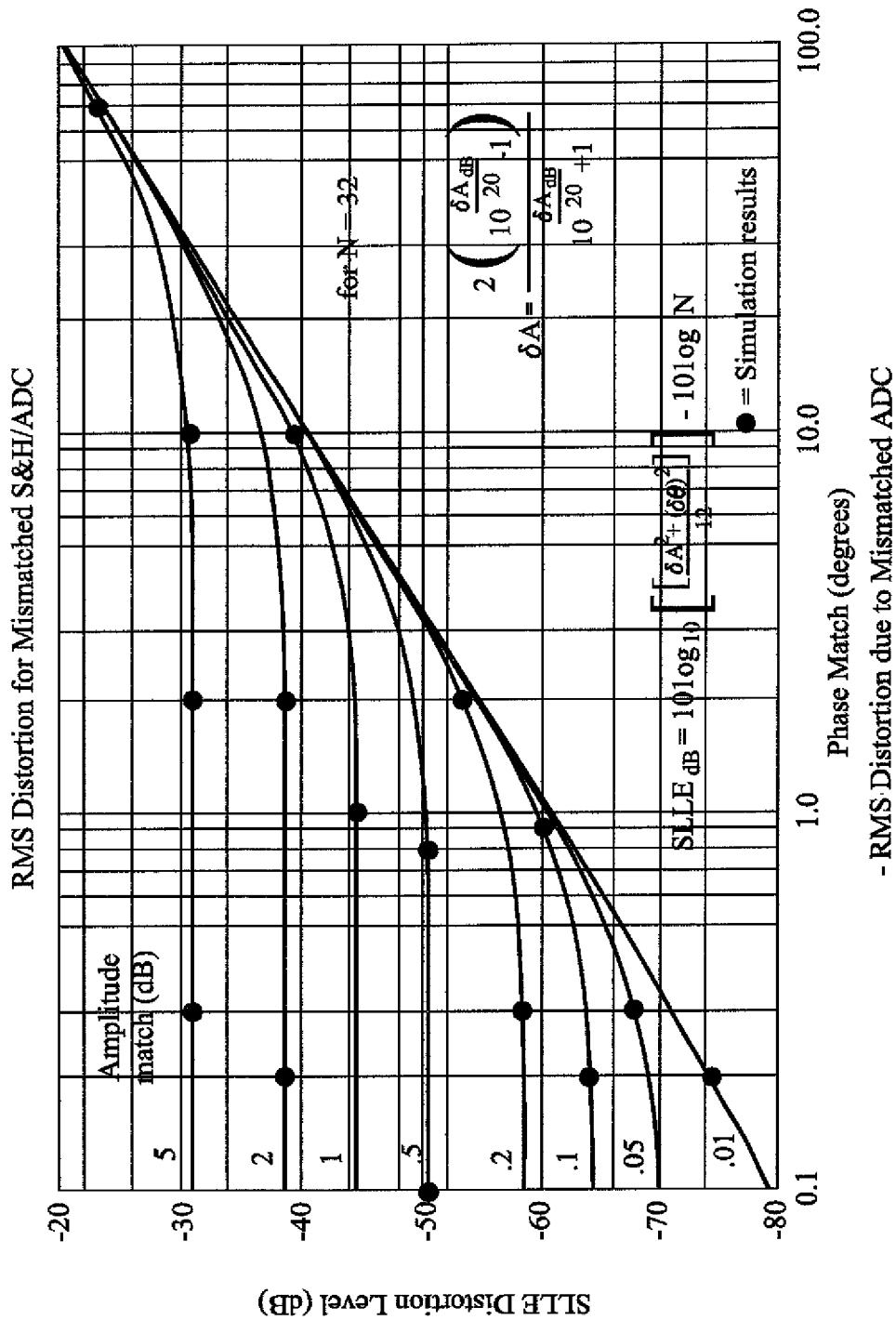
FIG. 13 is a chart showing RMS distortion due to mismatched ADCs.

Referring to FIG. 13, a chart showing RMS distortion due to mismatched ADCs is shown. The following analysis assumes that the channel match errors are uniformly distributed, and independent from channel to channel. The filtering process essentially averages the aforementioned errors. The variance of the errors decreases as a function the gain of the FIR filter. Assuming that the phase and amplitude errors are uniformly distributed, their variance is given by $$\sigma_{\delta A}^2 = \frac{\delta A^2}{12} \quad (15)$$

and by $$\sigma_{\delta \theta}^2 = \frac{\sin^2 \delta \theta}{12} \quad (16)$$

If it assumed these errors are also independent, their variances can be summed to obtain the impact of both on the frequency filter sidelobe level error (SLLE), which is given as:

$$SLLE_{dB} = 10 \log_{10} \left[ \frac{[\delta A^2 + \sin^2(\delta \theta)]}{12} \right] - G_{dB} \quad (17)$$

where $SLLE_{dB}$ the frequency sidelobe error level in dB, $\delta \theta$ is the span of phase errors (radians), $G_{dB}$ is the filter gain in dB, and $\delta A$ is the span in dB over which the amplitudes of all ADC channels must reside. For $\delta A$ given in dB, the following conversion translates this to $\delta A$ in equation 17:

$$\delta A = \frac{2 \left( 10^{\frac{\delta A_{dB}}{20}} - 1 \right)}{10^{\frac{\delta A_{dB}}{20}} + 1} \quad (18)$$

For small phase errors, $\sin^2 \delta \theta \approx \delta \theta^2$ and for FIR Filters, the gain can be approximated by $G_{dB} = 10 \log N$, so the error can be written as $$SLLE_{dB} = 10 \log_{10} \left[ \frac{[\delta A^2 + (\delta \theta)^2]}{12} \right] - 10 \log N \quad (19)$$

This is plotted in FIG. 13 with for filter order of 32. Here, the phase match has been converted from radians to degrees. The dots superimposed on the graph are the results of simulation.

Figure 14:
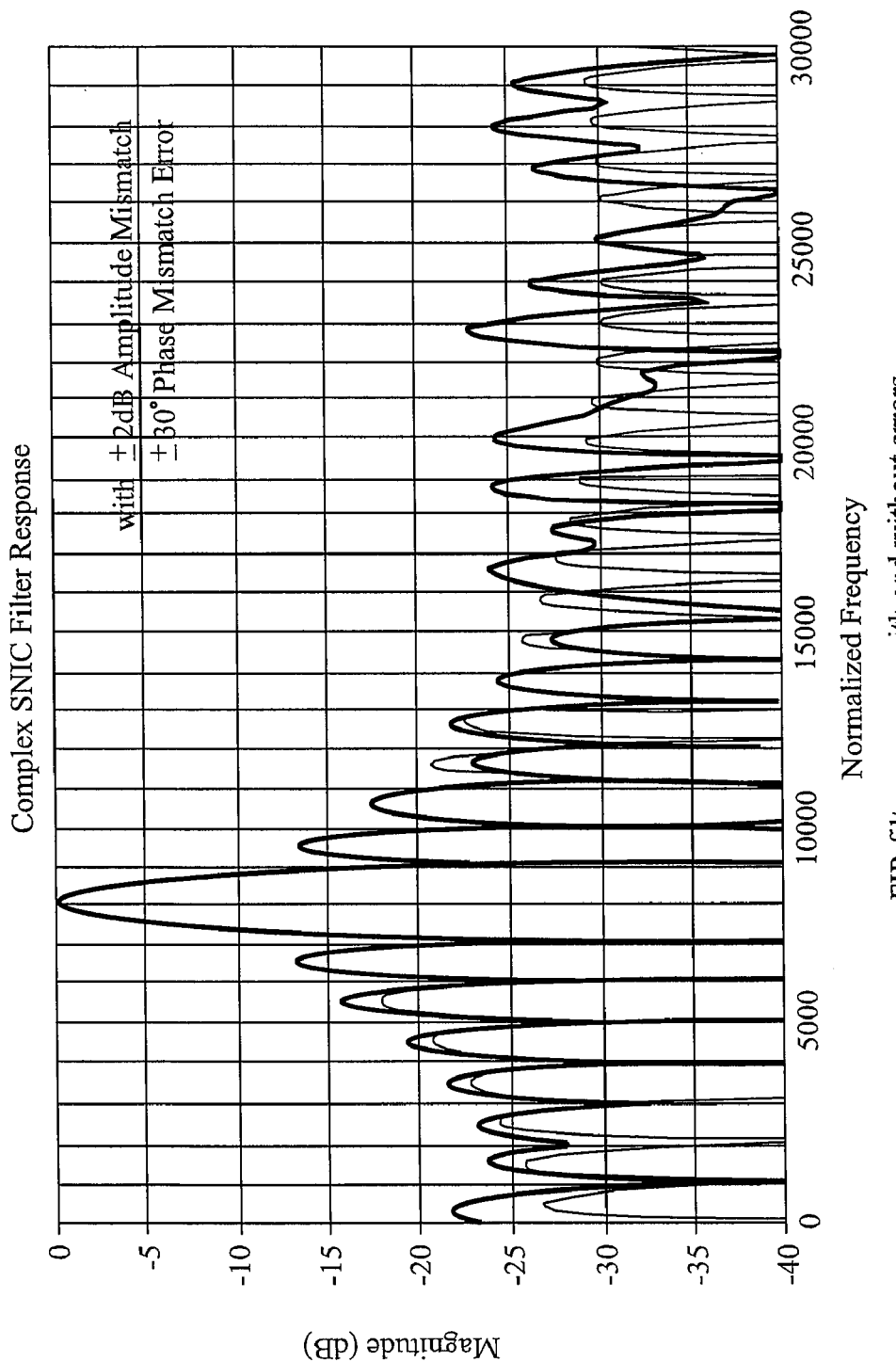
FIG. 14 is a chart showing complex SNIC filter response with/without errors.

Referring to FIG. 14, a chart showing complex SNIC filter response with/without errors is shown. The errors described above will generally add in a root sum square fashion to the SLL of the idea filter response. Accordingly, FIG. 14 an example of a $32^{nd}$ order filter response with no mismatch versus a filter with ±2 dB of amplitude mismatch and ±30 degrees of phase mismatch.

Although these errors will not result in spectral artifacts, they may impact the resulting match between the real and imaginary components. These errors can impact the quadrature characteristic of this relationship, and will result in less image rejection than anticipated. These errors must be kept low enough so that the impact is tolerable.

Figure 15:
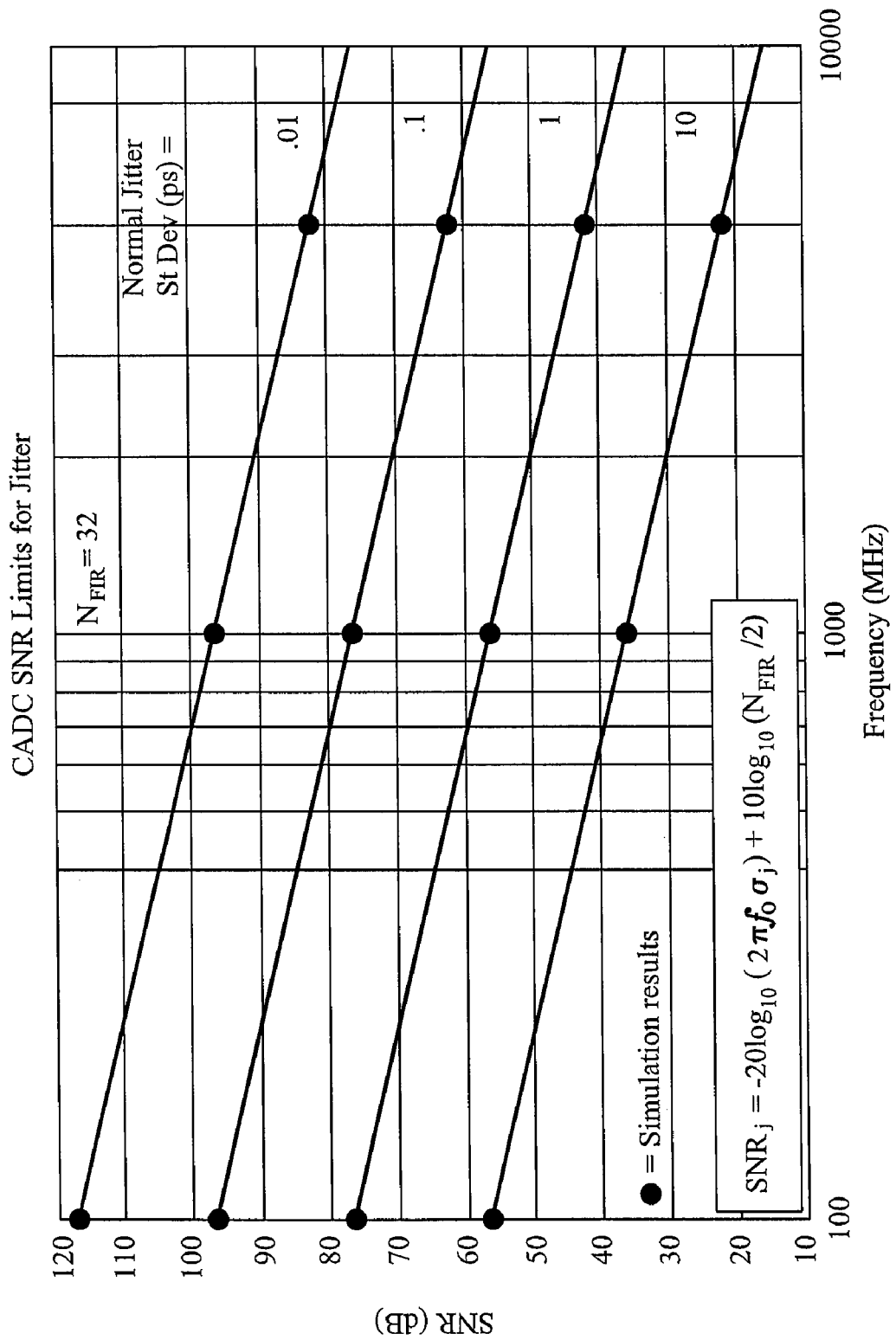
FIG. 15 is a chart showing jitter signal-to-noise ratio (SNR) versus frequency.

Another error that may impact any ADC implementation is illustrated by FIG. 15. FIG. 15 is a chart showing jitter signal-to-noise ratio (SNR) versus frequency. Timing jitter causes errors in the sampling clock which in turn causes error in the signal to be sampled. Jitter perturbs the normally uniform spacing of the sampling clock, and generally results in an increase in the ADC noise floor. The total jitter noise power for a sinusoidal signal may be expressed as:

$$P_j = 2\pi^2 f_o^2 A^2 \sigma_j^2 \quad (20)$$

where A is the amplitude of the signal, $\sigma_j$ is the standard deviation of the jitter with $2\pi f_o \sigma_j \ll 1$. The resulting signal to noise ratio (SNR) due to jitter can be expressed by:

$$SNR = 10 \log \frac{A^2 12}{2\pi^2 f_{in}^2 A^2 \sigma_j^2} = 20 \log(2\pi f_o \sigma_j) \text{dB} \quad (21)$$

Since the CADC includes a filter, this ratio improves by about one half the reciprocal of the normalized filter bandwidth, or about 10 log ($N_{FIR}/2$) dB to become:

$$SNR_j = -20 \log(2\pi f_o \sigma_j) + 10 \log(N_{FIR}/2_{[FIR]}) \quad (22)$$

Equation 22 is plotted in FIG. 15 for a filter order of 32.

Figure 16:
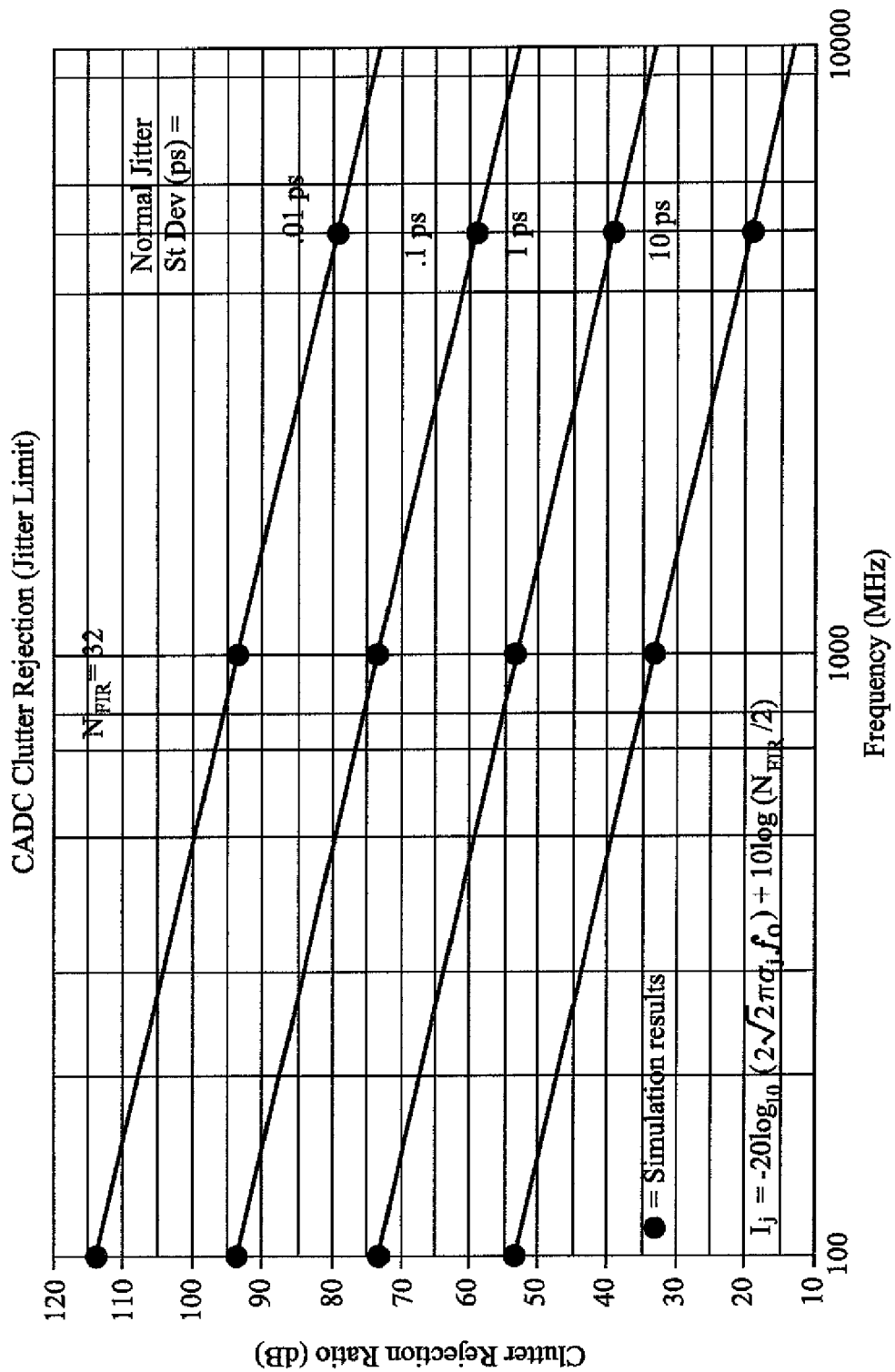
FIG. 16 is a chart illustrating CADC clutter rejection.

Referring to FIG. 16, Jitter will also have an impact on the amount of clutter rejection that can be achieved. The expression for the clutter rejection ratio due to jitter is as follows:

$$I_j = -10 \log \left( \frac{2}{3} (\pi \sigma)^2 B_e^2 \right) \quad (23)$$

where, $B_e = \sqrt{B^2 + 12 f_o^2}$, $I_j$ is the clutter rejection ratio in dB due to jitter, B is the instantaneous bandwidth, $\sigma_j$ is RMS jitter, and $f_o$ is the RF signal center frequency. Since CADC 10 includes filtering, this ratio will be improved upon by roughly half of the reciprocal of the normalized bandwidth of the FIR filter, or about 10 log($N_{FIR}/2$):

$$I_j = -10\log\left(\frac{2}{3}(\pi\sigma_j)^2 B_e^2\right) + 10\log(N_{FIR}/2) \quad (24)$$

FIG. 16 plots the clutter rejection ratio versus frequency for various jitter values and two bandwidths. The FIR filter order is 32. Note that above a few hundred MHz, the rejection ratio is relatively independent of bandwidth. For $f_o \gg B$:

$$I_j = -20\log(2\sqrt{2}\pi\sigma_j f_o) + 10\log(N_{FIR}/2) \quad (25)$$

Figure 17:
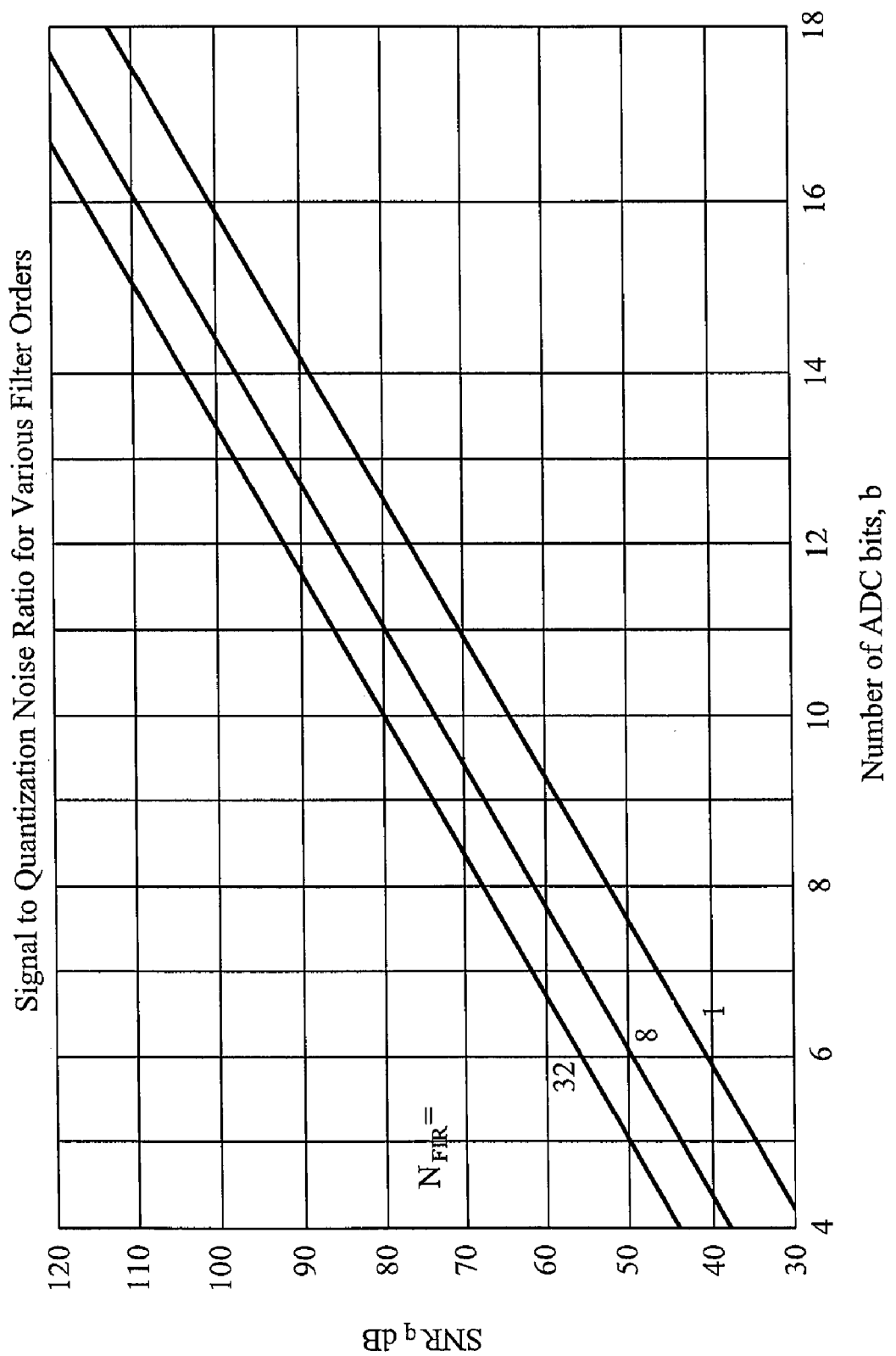
FIG. 17 is a chart showing the signal to quantization noise level versus the number of ADC bits.

Quantization noise is a factor in any ADC architecture. FIG. 17 is a chart showing the signal to quanhization noise level versus the number of ADC bits. The noise attributable to quantizing a signal for a single ADC is given as:

$$\sigma_q^2 = \frac{q^2}{12} = \frac{2^{-2(b-1)}}{12} \quad (26)$$

where b equals the number of bits of the ADC, q refers to the quantization level, and $\sigma_q^2$ is the quantization noise power referenced to maximum signal amplitude. This expression may be converted to a signal to quantization noise ratio by inverting equation (26) to obtain:

$$SNR_q = 10\log(12 * 2^{2(b-1)}) \quad (27)$$

This will improve due to the FIR filter by roughly half of the reciprocal of the normalized filter bandwidth, or 10 log (N/2) to obtain:

$$SNR_q = 10\log(12 * 2^{2(b-1)}) + 10\log(N/2) \quad (28)$$

The $SNR_q$ is plotted in FIG. 17 for various filter orders, N, and represents noise which contributes to the total noise of the CADC output, and can generally be assumed independent and added to other noise such as that due to jitter in a root-sum-square fashion.

Figure 18:
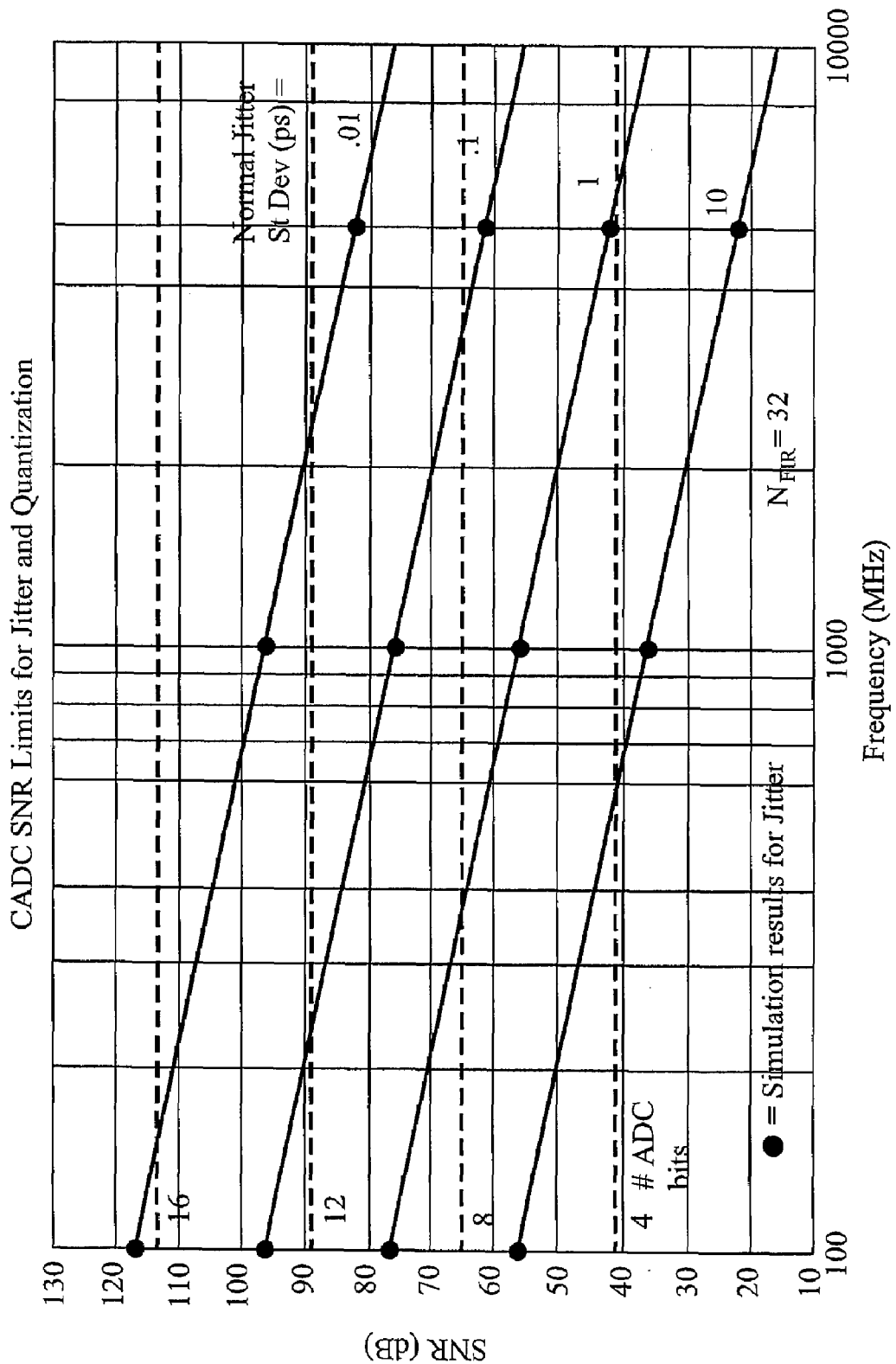
FIG. 18 is a chart that superimposes the SNR ratio limits for quantization noise on the SNR limits due to jitter.

FIG. 18 superimposes the SNR ratio limits for quantization noise on the SNR limits due to jitter. Again, a FIR filter order of 32 is assumed. These curves can be used as asymptotes of the total noise due to quantization and jitter. For example, at a 1 ps jitter at 100 MHz provide an SNR of 76 dB. If an 8 bit ADC were used, the SNR would be limited to just 65 dB.

Figure 19:
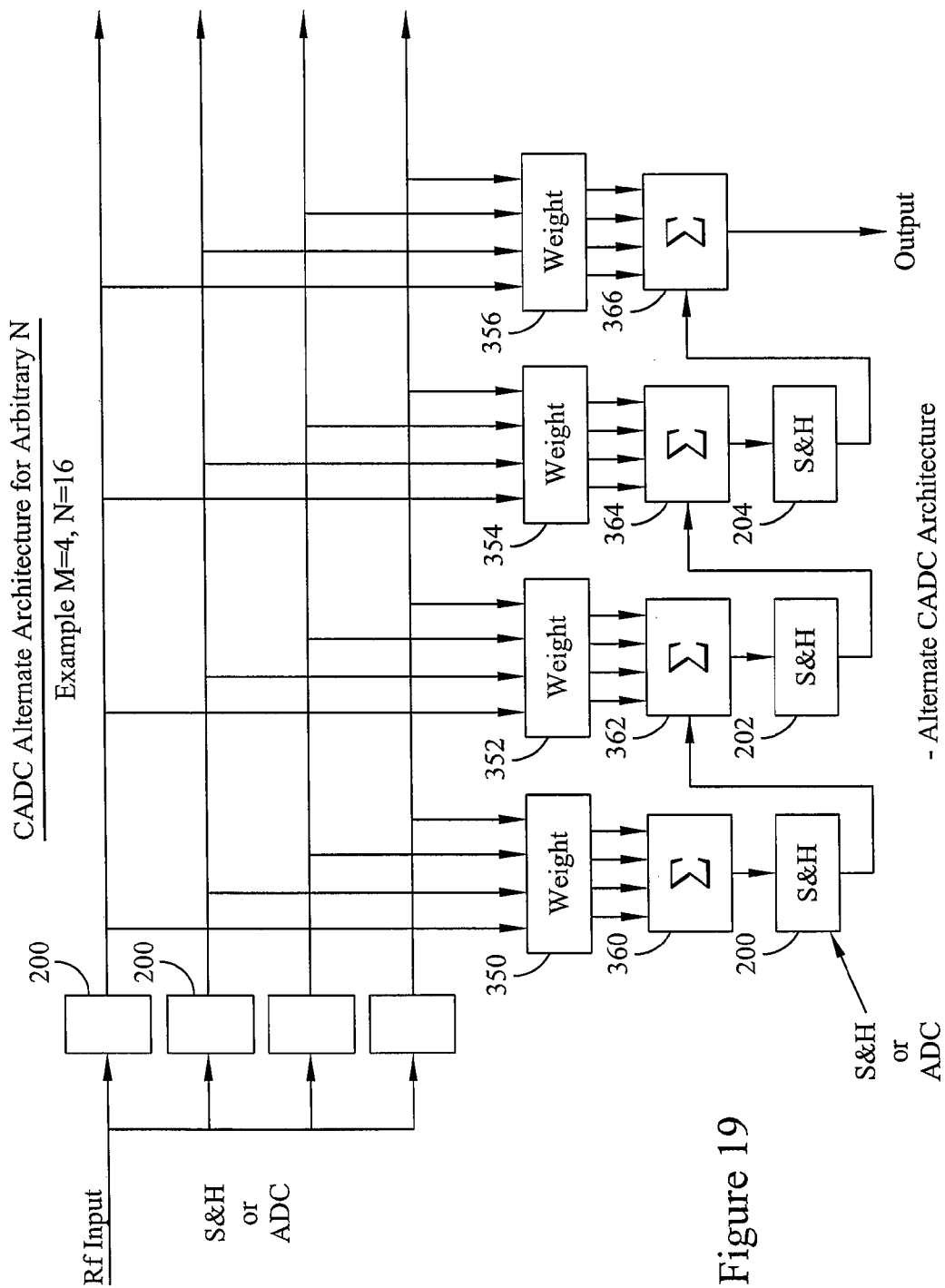
FIG. 19 is a block diagram of a CADC architecture in accordance with another embodiment of the present invention.

As embodied herein and depicted in FIG. 19, a block diagram of a CADC architecture in accordance with another embodiment of the present invention is disclosed. In the CADC architecture described above, the FIR filter order cannot be any greater than the sampling rate reduction ratio. This is because the resulting timing would cause overlapping sampling conditions that the architecture cannot accommodate. The architecture shown in FIG. 19 eliminates this constraint.

The sample rate reduction system includes M-RF sampling circuits configured to directly sample the RF signal at the sampling rate. The M-RF sampling circuits 200 may be analog to digital converters or sample and hold circuits. The complex bandpass filter includes M-complex bandpass filter circuits. The filter order is N, where N>M.

Each bandpass circuit includes a weighting circuit (350-356) in series with a summer circuit (360-366) and an output sample and hold circuit 200 (or ADC). The R-complex bandpass filter circuits are interconnected in series such that an output of the first sample and hold circuit 250 is coupled to an input of the summer circuit 362 of the subsequent complex bandpass filter circuit. The weighting circuits are configured to multiply each of the M-sample outputs by a predetermined filter weight value to thereby provide M-weighted sample output values. The summer circuits are configured to sum the M-weighted sample output values and the output values provided by the preceding complex bandpass filter circuit.

In this example, the sampling rate reduction ratio, M, is 4, while the filter order, N, is 16. The alternate architecture stores intermediate partial weighted sums of each of the M samples of sampling circuits 200. Groups of M partial sums are added together in sequence to obtain the overall filter length.

The architecture of FIG. 19 employs fewer than N S&H circuits (or ADCs) to perform the partial summing. In this example, only seven S&H, or ADCs 200, are needed to implement a 16$^{th}$ order filter. In general, the number of S&H (or ADC) this alternate architecture will use $N_{S\&H}$, is given as:

$$N_{S\&H} = M + \frac{N}{M} - 1 \quad (29)$$

Of course, most of this architecture can be implemented digitally, in which case, only M ADC are required, and a means to store the subsequent data. This time-interleaved data can then be operated upon to implement arbitrary filter orders, N. This architecture will enable significantly more alias rejection than the original concept which limits the filter size to $N \leq M$.

Figure 20:
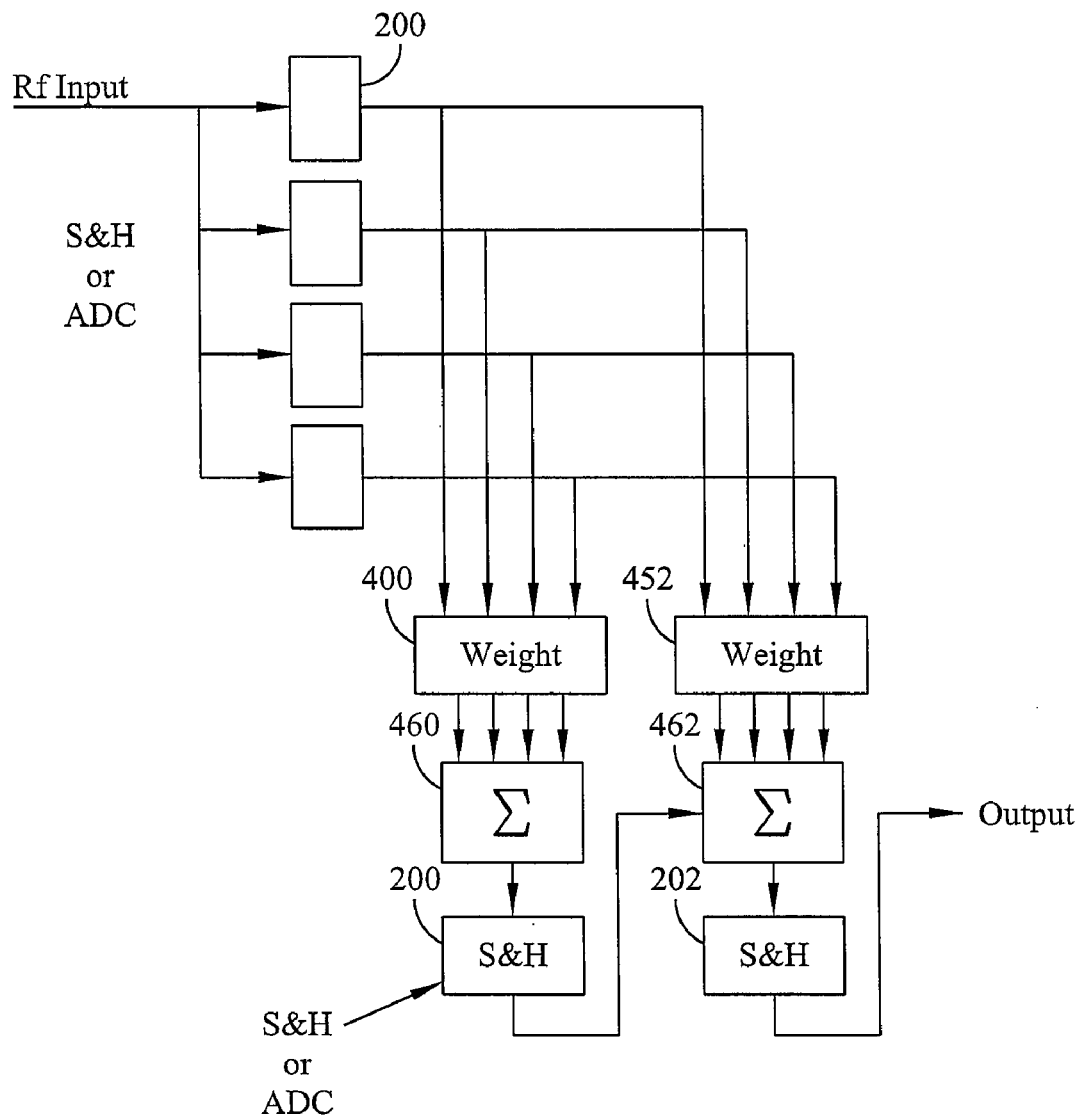
FIG. 20 is a block diagram of a triangular FIR CADC architecture in accordance with yet another embodiment of the present invention.

As embodied herein and depicted in FIG. 20, a block diagram of a triangular FIR CADC architecture in accordance with yet another embodiment of the present invention is disclosed. When a uniformly weighted filter is convolved with itself, a filter or order 2N−1 with triangular weights is generated.

Figure 21:
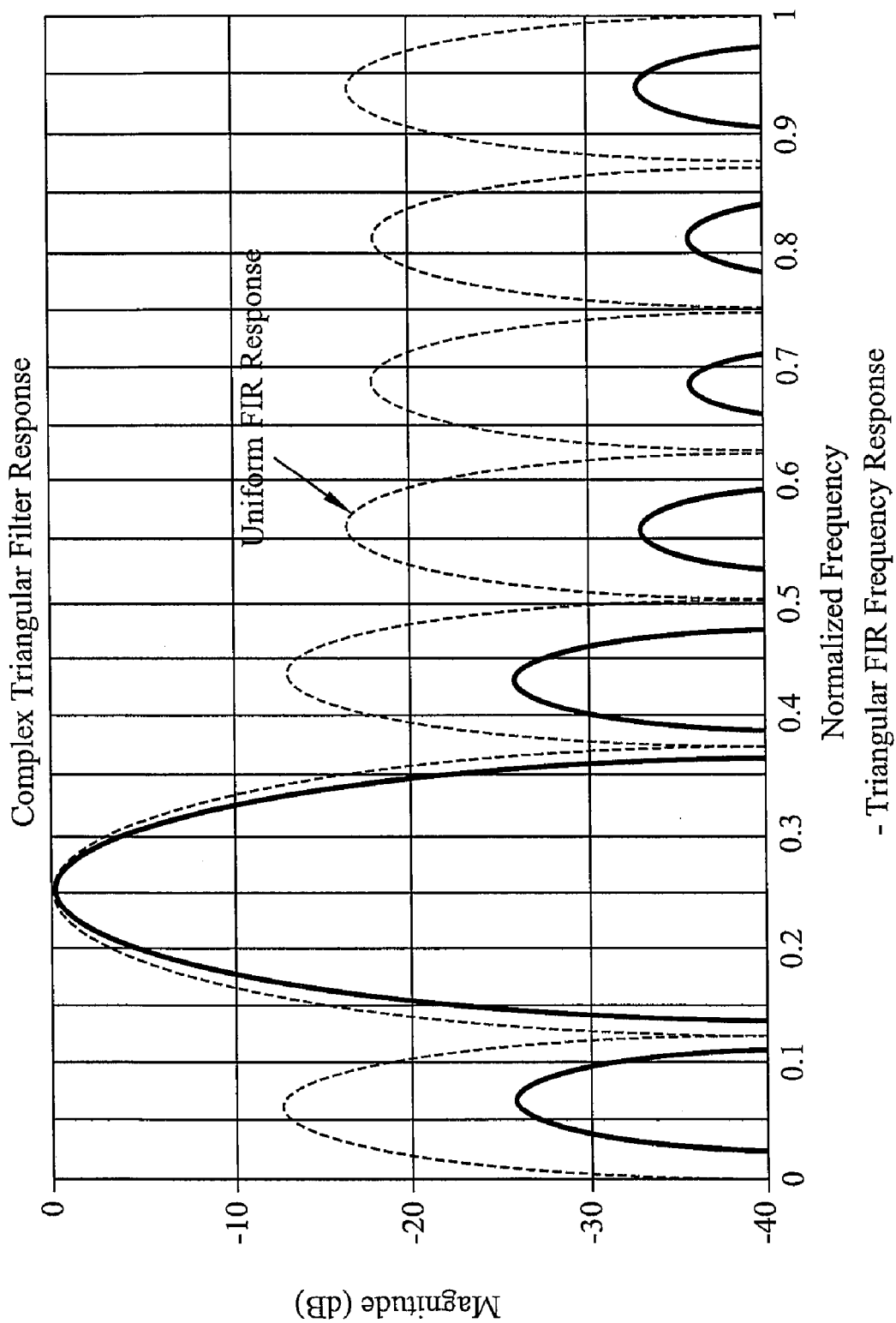
FIG. 21 is a chart illustrating the frequency response of the triangular FIR filter CADC shown in FIG 20.
Figure 22:
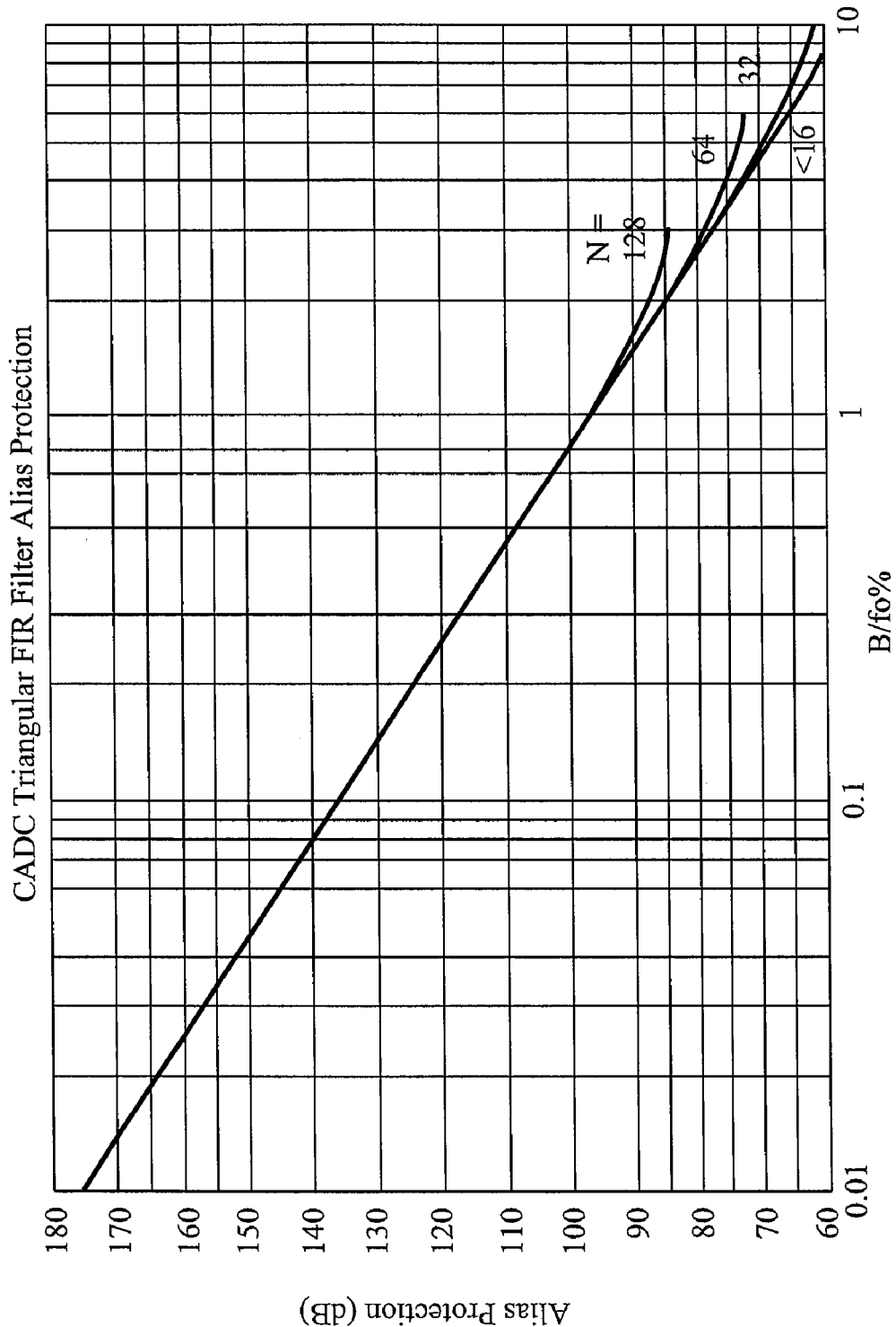
FIG. 22 is a chart illustrating the alias protection of the triangular FIR filter CADC shown in FIG. 20.

FIG. 21 is a chart illustrating the frequency response of the triangular FIR filter CADC shown in FIG. 20. The impact of this in the frequency domain is to basically square the frequency response, which doubles the alias attenuation in dB as shown in FIG. 22. This is superimposed on a uniform FIR response for comparison.

FIG. 22 is a chart illustrating the alias protection of the triangular FIR filter CADC shown in FIG. 20. This chart shows the corresponding alias protection as a function of percent bandwidth. Note the significant improvement in alias protection when compared to FIG. 12.

Figure 23:
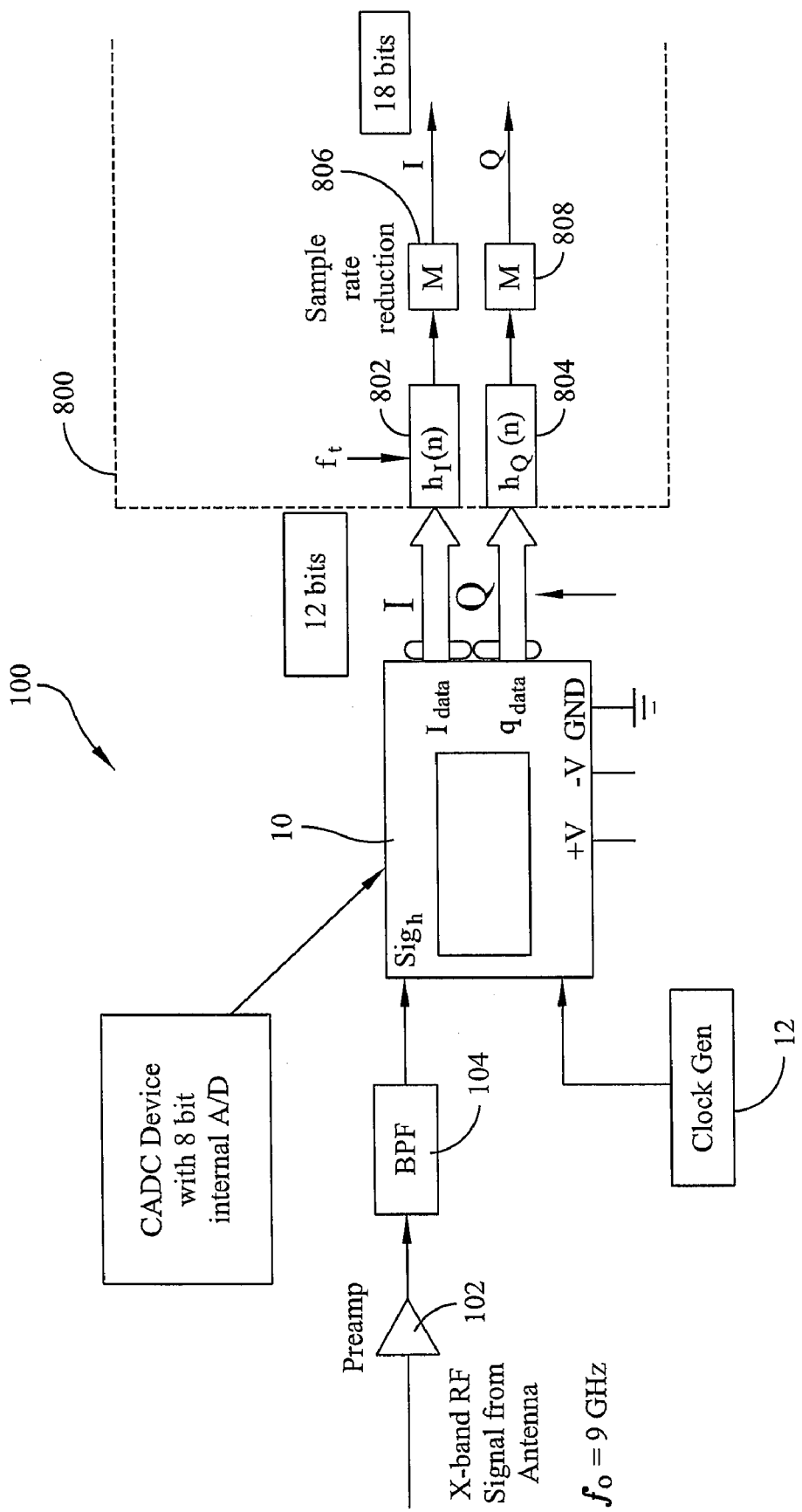
FIG. 23 is an example of an X-band radar processing architecture in accordance with yet another embodiment of the present invention.

Referring to FIG. 23, a radar processing architecture in accordance with yet another embodiment of the present invention is disclosed. In this example, an X-band radar processing architecture 100 is shown. System 100 includes an antenna (not shown) that is configured to direct an X-band signal into pre-amplifier 102. The X-band signal has, for example, a center frequency at 9 GHz. The RF signal is subsequently directed into a bandpass filter (BPF) 104. BPF 104 attenuates frequencies outside the BOI. The filtered signal is then directed into CADC 10. Of course, any of the embodiments previously discussed is appropriate for use in system 10. In the manner described above, a twelve (12) bit digital signal is provided to digital signal processor 800. In this example, the bandwidth of the digital signal is approximately 200 MHz. The actual bandwidth of the signal-of-interest is only 3 MHz. Thus, further processing is required. Accordingly, the in-phase and quadrature components of the digital signal are directed into in-phase FIR filter 802 and quadrature FIR filter 804. Finally, the sampling rate of the filtered digital signal is further reduced and a digital signal having an 18 bit word size is generated. The filtered digital signal is analyzed by the radar detection processing. Those skilled in the art will recognize that the present invention may be applied to any radar band, including L-band, S-band, C-band, X-band, Ku-band, K-band, Ka-band, V-band, W-band, or higher bands.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An analog to digital converter device comprising:
    an input configured to receive a radio frequency (RF) signal having a bandwidth centered at a first frequency;
    a plurality of delay elements each having an output and coupled in series to the input, wherein each output is configured to provide the RF signal with a temporal delay corresponding to a different number of the delay elements;
    a sample rate reduction system having a plurality of inputs each being coupled to a corresponding one of the delay element outputs, and configured to sample the delayed RF signals and provide M-sample outputs, each of the M-sample outputs being sampled at a reduced sampling rate equal to the sampling rate divided by M, M being an integer sample rate reduction value; and
    an $N^{th}$ order complex bandpass filter coupled to the sample rate reduction system, the complex bandpass filter being configured to filter each of the M-sample outputs to obtain a plurality of complex baseband signals;
    wherein the complex bandpass filter includes at least one filter element, each of the at least one filter elements being coupled to one of a plurality of M-analog to digital converters; and
    wherein each of the at least one filter elements includes a first filter element and a second filter element, the first filter element multiplying the sample output by an in-phase filter weight and the second filter element multiplying the sample output by a quadrature-phase filter weight.

2. The device of claim 1, wherein the M-sample outputs are digital values.

3. The device of claim 2, wherein the at least one filter element includes a multiplier configured to multiply a filter weight by one of the M-sample outputs.

4. The device of claim 3, wherein the filter weight is expressed as $$h(n) * e^{\left(\frac{j2\pi\left(n - \frac{N-1}{2}\right)f_o}{F_s}\right)}$$

where $f_o$ is the first frequency and $F_s$ is the sampling rate, and h(n) are the real coefficients of a lowpass filter prototype.

5. The device of claim 1, further comprising a first summer configured to sum first filter element outputs and a second summer configured to sum second filter element outputs.

6. The device of claim 5, wherein each analog to digital converter provides a sample output having b bits, the first summer and the second summer providing an output having $b+\log_2 N$ bits, where b is an integer.

7. The device of claim 1, wherein the complex bandpass filter is an $N^{th}$ order finite impulse response (FIR) filter.

8. An analog to digital converter device comprising:
    an input configured to receive a radio frequency (RF) signal having a bandwidth centered at a first frequency;
    a sample rate reduction system having a phase clock generator having a single input and N outputs, wherein the phase clock generator is configured to generate N-phase clocks; and
    an $N^{th}$ order complex bandpass filter coupled to the sample rate reduction system and coupled to the input, the complex bandpass filter being configured to sample the input in response to the phase clock generator,
    wherein the complex bandpass filter includes at least one filter element, each of the at least one filter elements being coupled to one of a plurality of M-analog to digital converters; and
    wherein each of the at least one filter elements includes a first filter element and a second filter element, the first filter element multiplying the sample output by an in-phase filter weight and the second filter element multiplying the sample output by a quadrature-phase filter weight.

* * * * *